United States Patent
Maeda et al.

(10) Patent No.: US 9,136,670 B2
(45) Date of Patent: Sep. 15, 2015

(54) CORRECTION CIRCUIT, DRIVE CIRCUIT, LIGHT EMISSION UNIT, AND METHOD OF CORRECTING CURRENT PULSE WAVEFORM

(71) Applicant: Sony Corporation, Tokyo (JP)

(72) Inventors: Osamu Maeda, Miyagi (JP); Katsuhisa Daio, Kagoshima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/030,345

(22) Filed: Sep. 18, 2013

(65) Prior Publication Data

US 2014/0105234 A1    Apr. 17, 2014

(30) Foreign Application Priority Data

Oct. 4, 2012 (JP) ................. 2012-222460

(51) Int. Cl.

| | |
|---|---|
| H01S 3/00 | (2006.01) |
| H01S 5/042 | (2006.01) |
| H01S 5/068 | (2006.01) |
| H01S 5/022 | (2006.01) |
| H01S 5/024 | (2006.01) |
| H01S 5/06 | (2006.01) |
| H01S 5/062 | (2006.01) |
| H01S 5/183 | (2006.01) |
| H01S 5/42 | (2006.01) |

(52) U.S. Cl.
CPC ........... *H01S 5/0428* (2013.01); *H01S 5/06804* (2013.01); *H01S 5/06808* (2013.01); *H01S 5/06812* (2013.01); *H01S 5/02276* (2013.01); *H01S 5/02469* (2013.01); *H01S 5/0617* (2013.01); *H01S 5/06226* (2013.01); *H01S 5/18313* (2013.01); *H01S 5/18391* (2013.01); *H01S 5/18394* (2013.01); *H01S 5/423* (2013.01)

(58) Field of Classification Search
CPC ............ H01S 5/0617; H01S 5/06209–5/06216
See application file for complete search history.

(56) References Cited

U.S. PATENT DOCUMENTS

| | | | |
|---|---|---|---|
| 6,807,206 B2* | 10/2004 | Tsukiji et al. | 372/34 |
| 2007/0030176 A1* | 2/2007 | Sanchez-Olea et al. | 341/13 |
| 2011/0075691 A1* | 3/2011 | Maeda et al. | 372/25 |
| 2011/0241571 A1* | 10/2011 | Maeda et al. | 315/307 |

FOREIGN PATENT DOCUMENTS

JP        2008-306118        12/2008

* cited by examiner

Primary Examiner — Julio J Maldonado
Assistant Examiner — Sean Hagan
(74) Attorney, Agent, or Firm — Sony Corporation

(57) ABSTRACT

A correction circuit includes a correction section configured to superpose a second current pulse on a first current pulse, and thereby correcting a waveform of the first current pulse, the first current pulse being output from a current source configured to drive a surface-emitting semiconductor laser in a pulsed manner, the correction section being configured to allow the second pulse to have a waveform obtained through attenuating a crest value of the second current pulse with time, increasing an initial crest value of the second current pulse by an amount that is larger as magnitude of the first current pulse is larger, and allowing the amount by which the initial crest value is increased to be smaller as ambient temperature of the semiconductor laser is higher, and being configured to output the second pulse having the waveform.

17 Claims, 17 Drawing Sheets

CORRECTION CIRCUIT, DRIVE CIRCUIT, LIGHT EMISSION UNIT, AND METHOD OF CORRECTING CURRENT PULSE WAVEFORM

CROSS REFERENCE TO RELATED APPLICATIONS

This application claims the benefit of priority under 35 U.S.C. §119 from Japanese Priority Patent Application JP 2012-222460 filed on Oct. 4, 2012, the entire contents of which is incorporated herein by reference.

BACKGROUND

The present technology relates to a correction circuit correcting a waveform of a current pulse to be applied to a surface-emitting semiconductor laser that emits laser light from a top face thereof. The present technology also relates to a drive circuit and a light emission unit that include the correction circuit. Further, the present technology also relates to a method of correcting the waveform of the current pulse to be applied to the semiconductor laser.

The surface-emitting semiconductor laser emits light in a direction perpendicular to a substrate, unlike an existing semiconductor layer of a Fabry-Perot resonator type. In the surface-emitting semiconductor laser, a number of resonator structures are allowed to be arranged in a two-dimensional array pattern on the same substrate. Therefore, the surface-emitting semiconductor laser has been attracted attention recently in technical fields of data communication, printers, etc.

The surface-emitting semiconductor laser typically has a mesa-type resonator structure in which a lower DBR layer, a lower spacer layer, an active layer, an upper spacer layer, a current confining layer, an upper DBR layer, and a contact layer are laminated in order on a substrate. In such a semiconductor laser, an oscillation wavelength is determined depending on an effective resonator length of the resonator structure, and magnitude of optical output is maximized at an emission wavelength corresponding to a band gap of the active layer. Therefore, typically, the resonator structure and the active layer are so configured that the effective resonator length of the resonator structure is equal to the emission wavelength of the active layer (see Japanese Unexamined Patent Application Publication No. 2008-306118).

SUMMARY

In the surface-emitting semiconductor laser, variation in device temperature causes variation in difference (wavelength detuning $\Delta\lambda$ between the effective resonator length of the resonator structure and the emission wavelength of the active layer, and a threshold current is varied in accordance with magnitude of the wavelength detuning $\Delta\lambda$. For example, as shown in FIG. 18, when the device temperature is varied, the threshold current is also varied. Further, as shown in FIG. 18, the device temperature causing minimum threshold current is higher when the wavelength detuning $\Delta\lambda$ is large ($\Delta\lambda=18.5$ nm) than when the wavelength detuning $\Delta\lambda$ is small ($\Delta\lambda=15.5$ nm). Therefore, in a red or infrared surface-emitting semiconductor laser in which high-output operation is difficult at high temperature, the wavelength detuning $\Delta\lambda$ may be preferably large so that the threshold current becomes small.

However, another disadvantage has been caused when the wavelength detuning $\Delta\lambda$ is large. For example, when the red or infrared surface-emitting semiconductor laser is driven in a pulsed manner under a condition that the wavelength detuning $\Delta\lambda$ is large, a waveform of optical output is dulled disadvantageously compared to a waveform of a current pulse as shown in Parts (A) and (B) of FIG. 19.

It is desirable to provide a correction circuit and a method of correcting a current pulse waveform that are capable of reducing dullness in waveform of optical output caused by the wavelength detuning $\Delta\lambda$. It is also desirable to provide a drive circuit and a light emission unit that include the correction circuit.

According to embodiment (1) of the present technology, there is provided a correction circuit including a correction section configured to superpose a second current pulse on a first current pulse, and thereby correcting a waveform of the first current pulse, the first current pulse being output from a current source configured to drive a surface-emitting semiconductor laser in a pulsed manner, the correction section being configured to allow the second current pulse to have a waveform obtained through attenuating a crest value of the second current pulse with time, increasing an initial crest value of the second current pulse by an amount that is larger as magnitude of the first current pulse is larger, and allowing the amount by which the initial crest value is increased to be smaller as ambient temperature of the semiconductor laser is higher, and being configured to output the second current pulse having the waveform.

According to embodiment (2) of the present technology, there is provided a correction circuit including a correction section configured to superpose a second current pulse on a first current pulse, and thereby correcting a waveform of the first current pulse, the first current pulse being output from a current source configured to drive a surface-emitting semiconductor laser in a pulsed manner, the correction section being configured to allow the second current pulse to have a waveform obtained through superposing a second pulse waveform on a first pulse waveform, and being configured to output the second current pulse having the waveform, the first pulse waveform being obtained through attenuating with time a crest value of a first pulse that is a positive crest value, increasing an initial crest value of the first pulse in a positive direction by an amount that is larger as magnitude of the first current pulse is larger, and allowing the amount by which the initial crest value of the first pulse is increased in the positive direction to be smaller as the ambient temperature of the semiconductor laser is higher, and the second pulse waveform being obtained through attenuating with time a crest value of a second pulse that is a negative crest value, increasing an initial crest value of the second pulse in a negative direction by an amount that is larger as the magnitude of the first current pulse is larger, and allowing the amount by which the initial crest value of the second pulse is increased in the negative direction to be larger as the ambient temperature of the semiconductor laser is higher.

According to embodiment (3) of the present technology, there is provided a drive circuit including: a current source configured to drive a surface-emitting semiconductor laser in a pulsed manner; and a correction circuit configured to superpose a second current pulse on a first current pulse, and thereby correcting a waveform of the first current pulse, the first current pulse being output from the current source, the correction circuit being configured to allow the second current pulse to have a waveform obtained through attenuating a crest value of the second current pulse with time, increasing an initial crest value of the second current pulse by an amount that is larger as magnitude of the first current pulse is larger, and allowing the amount by which the initial crest value is increased to be smaller as ambient temperature of the semiconductor laser is higher, and being configured to output the second current pulse having the waveform.

According to embodiment (4) of the present technology, there is provided a drive circuit including: a current source configured to drive a surface-emitting semiconductor laser in a pulsed manner; and a correction circuit configured to superpose a second current pulse on a first current pulse, and thereby correcting a waveform of the first current pulse, the first current pulse being output from the current source, the correction circuit being configured to allow the second current pulse to have a waveform obtained through superposing a second pulse waveform on a first pulse waveform, and being configured to output the second current pulse having the waveform, the first pulse waveform being obtained through attenuating with time a crest value of a first pulse that is a positive crest value, increasing an initial crest value of the first pulse in a positive direction by an amount that is larger as magnitude of the first current pulse is larger, and allowing the amount by which the initial crest value of the first pulse is increased in the positive direction to be smaller as the ambient temperature of the semiconductor laser is higher, and the second pulse waveform being obtained through attenuating with time a crest value of a second pulse that is a negative crest value, increasing an initial crest value of the second pulse in a negative direction by an amount that is larger as the magnitude of the first current pulse is larger, and allowing the amount by which the initial crest value of the second pulse is increased in the negative direction to be larger as the ambient temperature of the semiconductor laser is higher.

According to embodiment (5) of the present technology, there is provided a light emission unit including: one or more surface-emitting semiconductor lasers; a current source configured to drive the one or more surface-emitting semiconductor lasers in a pulsed manner; and a correction circuit configured to superpose a second current pulse on a first current pulse, and thereby correcting a waveform of the first current pulse, the first current pulse being output from the current source, the correction circuit being configured to allow the second current pulse to have a waveform obtained through attenuating a crest value of the second current pulse with time, increasing an initial crest value of the second current pulse by an amount that is larger as magnitude of the first current pulse is larger, and allowing the amount by which the initial crest value is increased to be smaller as ambient temperature of the semiconductor laser is higher, and being configured to output the second current pulse having the waveform.

According to embodiment (6) of the present technology, there is provided a light emission unit including: one or more surface-emitting semiconductor lasers; a current source configured to drive the one or more surface-emitting semiconductor lasers in a pulsed manner; and a correction circuit configured to superpose a second current pulse on a first current pulse, and thereby correcting a waveform of the first current pulse, the first current pulse being output from the current source, the correction circuit being configured to allow the second current pulse to have a waveform obtained through superposing a second pulse waveform on a first pulse waveform, and being configured to output the second current pulse having the waveform, the first pulse waveform being obtained through attenuating with time a crest value of a first pulse that is a positive crest value, increasing an initial crest value of the first pulse in a positive direction by an amount that is larger as magnitude of the first current pulse is larger, and allowing the amount by which the initial crest value of the first pulse is increased in the positive direction to be smaller as the ambient temperature of the semiconductor laser is higher, and the second pulse waveform being obtained through attenuating with time a crest value of a second pulse that is a negative crest value, increasing an initial crest value of the second pulse in a negative direction by an amount that is larger as the magnitude of the first current pulse is larger, and allowing the amount by which the initial crest value of the second pulse is increased in the negative direction to be larger as the ambient temperature of the semiconductor laser is higher.

According to embodiment (7) of the present technology, there is provided a method of correcting a current pulse waveform, the method including: superposing a second current pulse on a first current pulse, and thereby correcting a waveform of the first current pulse, the first current pulse being output from a current source configured to drive a surface-emitting semiconductor laser in a pulsed manner; and in the correcting of the waveform of the first current pulse, generating the second current pulse through attenuating a crest value of the second current pulse with time, increasing an initial crest value of the second current pulse by an amount that is larger as magnitude of the first current pulse is larger, and allowing the amount by which the initial crest value is increased to be smaller as ambient temperature of the semiconductor laser is higher.

According to embodiment (8) of the present technology, there is provided a method of correcting a current pulse waveform, the method including: superposing a second current pulse on a first current pulse, and thereby correcting a waveform of the first current pulse, the first current pulse being output from a current source configured to drive a surface-emitting semiconductor laser in a pulsed manner; and in the correcting the waveform of the first current pulse, generating the second current pulse through superposing a second pulse waveform on a first pulse waveform, the first pulse waveform being obtained through attenuating with time a crest value of a first pulse that is a positive crest value, increasing an initial crest value of the first pulse in a positive direction by an amount that is larger as magnitude of the first current pulse is larger, and allowing the amount by which the initial crest value of the first pulse is increased in the positive direction to be smaller as the ambient temperature of the semiconductor laser is higher, and the second pulse waveform being obtained through attenuating with time a crest value of a second pulse that is a negative crest value, increasing an initial crest value of the second pulse in a negative direction by an amount that is larger as the magnitude of the first current pulse is larger, and allowing the amount by which the initial crest value of the second pulse is increased in the negative direction to be larger as the ambient temperature of the semiconductor laser is higher.

In the correction circuit, the drive circuit, the light emission unit, and the method of correcting the current pulse waveform according to the above-described embodiments (1), (3), (5), and (7), respectively, the crest value of the second current pulse is attenuated with time. Further, the initial crest value of the second current pulse is increased by the amount that is larger as the magnitude of the first current pulse is larger. Further, the amount by which the initial crest value of the second current pulse is increased is smaller as the ambient temperature of the semiconductor laser is higher. Accordingly, the waveform of the current pulse outputted from the current source is corrected by the correction circuit so that the pulse waveform of the optical output of the semiconductor laser becomes closer to a rectangular shape.

In the correction circuit, the drive circuit, the light emission unit, and the method of correcting the current pulse waveform according to the above-described embodiments (2), (4), (6), and (8), respectively, the first pulse waveform is the waveform obtained through attenuating the crest value of the first pulse which is a positive crest value, increasing the initial crest value of the first pulse in the positive direction by the amount that is larger as the magnitude of the first current pulse is larger, and allowing the amount by which the initial crest value of the first pulse is increased in the positive direction to be smaller as the ambient temperature of the semiconductor laser is higher. Accordingly, the waveform of the current pulse outputted from the current source is corrected by the correction circuit so that the pulse waveform of the optical output of the semiconductor laser becomes closer to a rectangular shape.

According to the correction circuits, the drive circuits, the light emission units, and the methods of correcting the current pulse waveform according to the above-described embodiments (1) to (8), respectively, it is possible to correct the pulse waveform of the optical output of the semiconductor laser by the correction circuit so as to become closer to a rectangular shape. Therefore, dullness in the waveform of the optical output caused by the wavelength detuning $\Delta\lambda$ is reduced.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Some embodiments of the present technology will be described below in detail with reference to the drawings. The description will be given in the following order.
1. First Embodiment (rising assisting correction)
2. Second Embodiment (rising assisting correction+droop correction)

1. First Embodiment

Configuration

Figure 1:
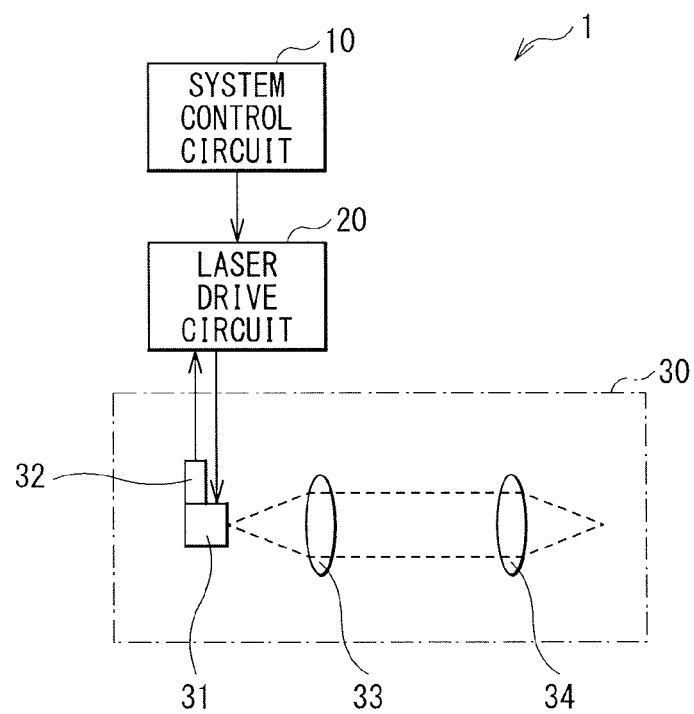
FIG. 1 is a diagram illustrating an example of a schematic configuration of a light emission unit according to a first embodiment of the present technology.

FIG. 1 illustrates an example of a schematic configuration of a light emission unit 1 according to a first embodiment of the present technology. The light emission unit 1 may include, for example, a system control circuit 10, a laser drive circuit 20, and an optical system 30, as shown in FIG. 1. The system control circuit 10 controls drive of a semiconductor laser device 31 via the laser drive circuit 20. The optical system 30 may include, for example, the semiconductor laser device 31, a temperature detection section 32, a collimator lens 33, and an objective lens 34.

Figure 2:
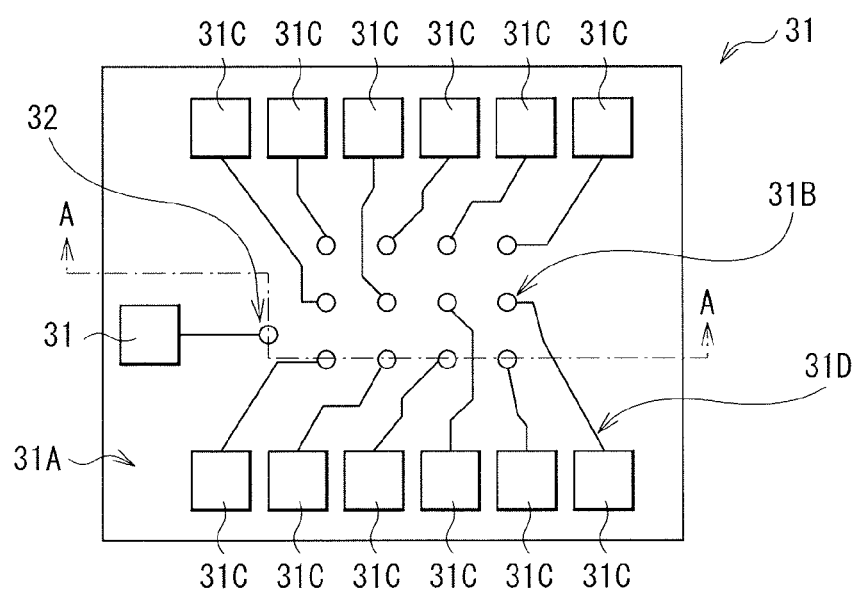
FIG. 2 is a diagram illustrating an example of a top-face configuration of a semiconductor laser device illustrated in FIG. 1.
Figure 3:
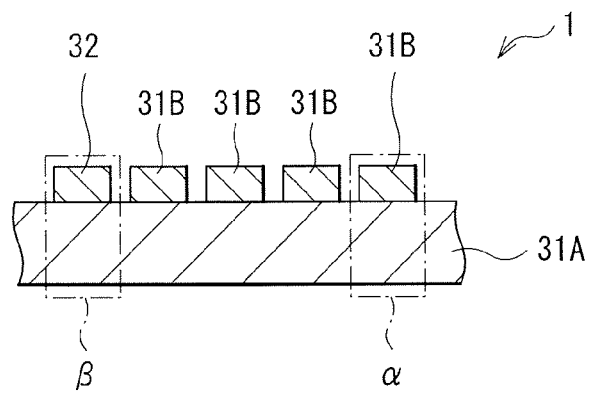
FIG. 3 is a diagram illustrating an example of a cross-sectional configuration of the semiconductor laser device in an arrow A-A direction in FIG. 2.

FIG. 2 illustrates an example of a top-face configuration of the semiconductor laser device 31. FIG. 3 illustrates an example of a cross-sectional configuration of the semiconductor laser device 31 in an arrow A-A direction shown in FIG. 2. The semiconductor laser device 31 may be provided, for example, with a plurality of laser structure sections 31B on a top face of a substrate 31A. One temperature detection section 32 may be provided on the top face of the substrate 31A. FIG. 2 illustrates, as an example, a case in which twelve laser structure sections 31B are two-dimensionally arranged on the top face of the substrate 31A. However, the number of the laser structure sections 31B is not particularly limited. Further, FIG. 2 illustrates, as an example, a case in which one temperature detection section 32 is provided on the top face of the substrate 31A. However, a plurality of temperature detection sections 32 may be provided on the top face of the substrate 31A.

Each laser structure section 31B is a surface-emitting semiconductor laser that emits light in a direction of a normal to the substrate 31A. Each laser structure section 31B has a vertical resonator structure in which an active layer is sandwiched by a pair of multilayer reflectors. The active layer may include, for example, a material for red semiconductor lasers (such as GaInP and AlGaInP). In this case, waveform detuning $\Delta\lambda$ that is a difference between an emission wavelength of the active layer and an oscillation wavelength of the laser structure section 31B is 15 nm or larger. It is to be noted that the active layer may be configured of other materials such as a material for infrared semiconductor lasers (such as GaAs and AlGaAs). In this case, the waveform detuning $\Delta\lambda$ is 13 nm or larger.

The temperature detection section 32 is configured to detect ambient temperature of the semiconductor laser. The temperature detection section 32 is a semiconductor temperature detection section, and may be configured, for example, of a surface-emitting semiconductor laser that does not emit light to outside. Each of the laser structure sections 31B and the temperature detection section 32 is electrically connected to a pad electrode 31C via an extraction wiring 31D. The collimator lens 33 is an optical element that shapes laser light emitted from the semiconductor laser device 31 into parallel light. The objective lens 34 is an optical element that condenses the laser light shaped into parallel light by the collimator lens 33 and applies the condensed light toward an object to be illuminated which is not illustrated.

Figure 4:
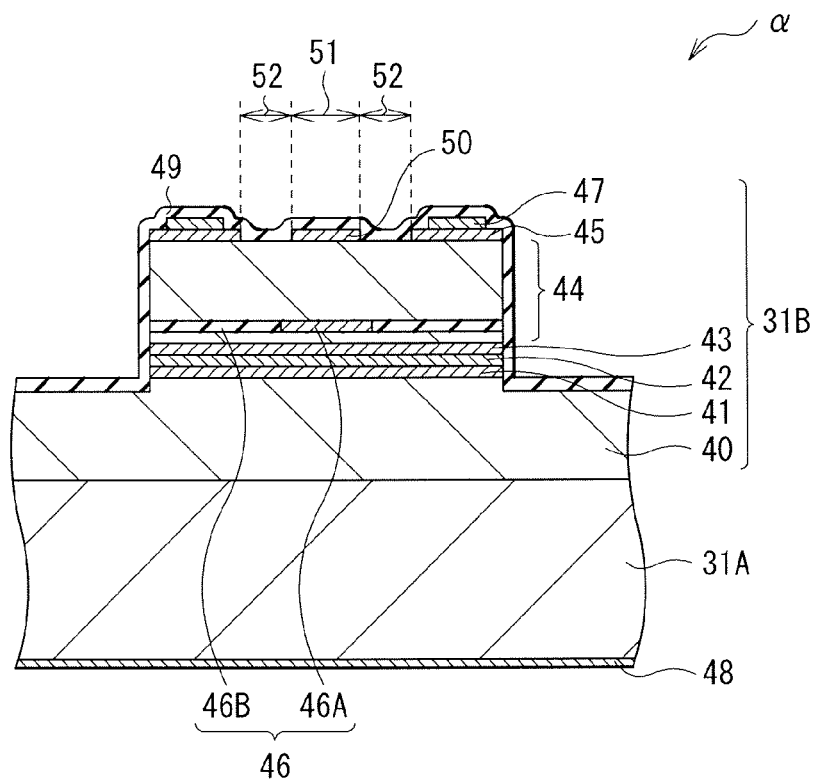
FIG. 4 is a diagram illustrating an example of a cross-sectional configuration of the semiconductor laser device shown in FIG. 1.
Figure 5:
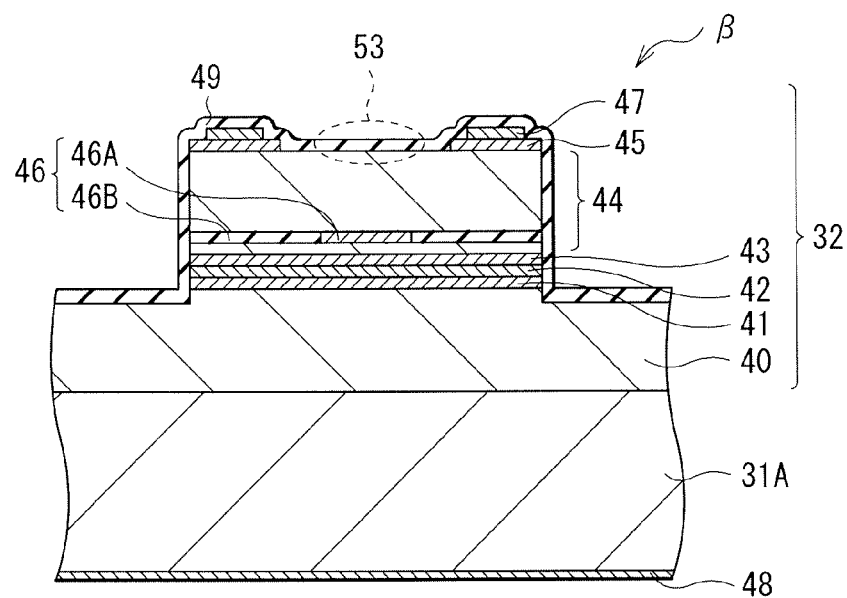
FIG. 5 is a diagram illustrating an example of a cross-sectional configuration of a temperature detection section shown in FIG. 1.

FIG. 4 illustrates, in an enlarged manner, an example of a cross-sectional configuration of a portion α (see FIG. 3) that includes one laser structure section 31B in the semiconductor laser device 31. FIG. 5 illustrates, in an enlarged manner, an example of a cross-sectional configuration of a portion β (see FIG. 3) that includes one temperature detection section 32 in the semiconductor laser device 31. In the present embodiment, the laser structure section 31B and the temperature detection section 32 are both formed on the substrate 31A as a growth substrate, and may have, for example, the same lamination structure as shown in FIGS. 4 and 5.

The laser structure section 31B and the temperature detection section 32 may be both configured, for example, by laminating a lower DBR layer 40, a lower spacer layer 41, an active layer 42, an upper spacer layer 43, an upper DBR layer 44, and a contact layer 45 in order from the substrate 31A. In other words, a lamination portion (PIN junction portion) from the lower DBR layer 40 to the contact layer 45 in the laser structure section 31B has the same lamination structure as that in the temperature detection section 32.

The laser structure section 31B and the temperature detection section 32 may each include, for example, a current confining layer 46 in part of the upper DBR layer 44. Further, the laser structure section 31B and the temperature detection section 32 each have a mesa shape. Specifically, the lamination portion from the upper portion of the lower DBR layer 40 to the contact layer 45 thereof has a mesa shape. The contact layer 45 may be formed, for example, only in an outer edge portion of the top face of the upper DBR layer 44 as shown in FIGS. 4 and 5. It is to be noted that the contact layer 45 may be formed on the top face as a whole of the upper DBR layer 44.

The substrate 31A may be, for example, an n-type GaAs substrate. The lower DBR layer 40 is a multilayer reflector in which low refractive-index layers and high refractive-index layers are alternately laminated, which is not illustrated. In this example, the low refractive-index layer may be configured, for example, of an n-type $Al_{x1}Ga_{1-x1}As$ having an optical thickness of $\lambda/4$ ($\lambda$ is an oscillation wavelength), and the high refractive-index layer may be configured, for example, of an n-type $Al_{x2}Ga_{1-x2}As$ (x1>x2) having an optical thickness of $\lambda/4$. Examples of n-type impurity may include silicon (Si) and selenium (Se). The lower spacer layer 41 may be configured, for example, of undoped AlGaAs. The active layer 42 may be configured, for example, of an undoped GaAs-based material. In the active layer 42, a region that faces a current injection region 46A which will be described later is a light emission region. The upper spacer layer 43 may be configured, for example, of undoped AlGaAs.

The upper DBR layer 44 is a multilayer reflector in which low refractive-index layers and high refractive-index layers are alternately laminated, which is not illustrated. In this case, the low refractive-index layer may be configured, for example, of a p-type $Al_{x3}Ga_{1-x3}As$ having an optical thickness of $\lambda/4$, and the high refractive-index layer may be configured, for example, of an n-type $Al_{x4}Ga_{1-x4}As$ (x3>x4) having an optical thickness of $\lambda/4$. The contact layer 45 may be configured, for example, of p-type GaAs. Examples of p-type impurity may include zinc (Zn), magnesium (Mg), and beryllium (Be). The current confining layer 46 has a current confining region 46B in an outer edge region thereof, and has the current injection region 46A in a central region thereof. The current injection region 46A may be configured, for example, of p-type AlGaAs, p-type AlAs, or the like. The current confining region 46B includes $Al_2O_3$ (aluminum oxide), and is obtained through oxidizing, from the side face, Al included in AlGaAs or AlAs at high concentration in manufacturing process. Therefore, the current confining layer 46 has a function of confining a current.

In the laser structure section 31B and the temperature detection section 32, a circular top electrode 47 is formed on the top face of the contact layer 45. The top electrode 47 has an opening in a region corresponding to the above-described current injection region 46A. The top electrode 47 is connected to the extraction wiring 31D. A lower electrode 48 is formed on a back face of the substrate 31A. The lower electrode 48 serves as a common electrode shared by the respective laser structures 31B and the temperature detection section 32. Further, an insulating layer 49 is formed on a surface (side faces and a top face) of the laser structure section 31B and the temperature detection section 32. The insulating layer 49 covers side faces and a top face of the mesa-shaped portion of the laser structure section 31B and of the temperature detection section 32.

In this example, the top electrode 47 and the pad electrode 31C may be configured, for example, by laminating titanium (Ti), platinum (Pt), and gold (Au) in order, and may be electrically connected to the contact layer 45. The extraction wiring 31D may be configured, for example, of solder. The lower electrode 48 may have, for example, a structure in which an alloy of gold (Au) and germanium (Ge), nickel (Ni), and gold (Au) are laminated in order from the substrate 31A, and may be electrically connected to the substrate 31A.

A phase adjustment layer 50 is formed on the top face of the laser structure section 31B, specifically, between the top face of the semiconductor portion of the laser structure section 31B and the insulating layer 49. The phase adjusting layer 50 is formed in a central region (that is, a region in which basic-lateral-mode oscillation occurs mainly) in the region that allows laser light to pass outward. In this example, a lamination portion that is configured of a portion, of the insulating layer 49, that faces the phase adjustment layer 50 and the phase adjustment layer 50 configures a high reflectance region 51. A portion, of the insulating layer 49, that does not face the phase adjustment layer 50 and is an outer edge portion (that is, a region in which high-order lateral mode oscillation occurs mainly) of the region that allows laser light to pass outward configures a low reflectance region 52.

The phase adjustment layer 50 has a thickness of $(2a-1)\lambda/4n_1$ ("a" is an integer of 1 or larger, and $n_1$ is a refractive index), and is configured of a material that has the refractive index $n_1$ lower than a refractive index of the top face of the semiconductor portion of the laser structure section 31B, for example, a dielectric body such as $SiO_2$ (silicon oxide). The portion, of the insulating layer 49, facing the phase adjustment layer 50 has a thickness of $(2b-1)\lambda/4n_2$ ("b" is an integer of 1 or larger, and $n_2$ is a refractive index), and is configured of a material that has the refractive index $n_2$ higher than the refractive index $n_1$ of the phase adjustment layer 50. The portion, of the insulating layer 49, that does not face the phase adjustment layer 50 and is the outer edge portion of the region that allows laser light to pass outward has a thickness of $(2c-1)\lambda/4n_3$ ("c" is an integer of 1 or larger, and $n_3$ is a refractive index), and is configured of a material that has the refractive index $n_3$ lower than the refractive index $n_1$ of the phase adjustment layer 50.

In this example, each reflectance may be preferably adjusted so as to satisfy a relationship represented by the following expression where $R_1$ is reflectance of the high reflectance region 51, $R_2$ is reflectance of the low reflectance region 52, and $R_3$ is reflectance in a case where the insulating layer 49 and the phase adjustment layer 50 are not provided in the region that allows laser light to pass outward. Thus, only the high-order lateral mode oscillation is suppressed without reducing optical output in a basic lateral mode.

$$R_1 \geq R_3 > R_2$$

It is to be noted that the phase adjustment layer 50 may be omitted as necessary. However, in this case, the insulating layer 49 may preferably have a thickness by which reflectance is not lowered in the region that allows laser light to pass outward.

On the other hand, in the temperature detection section 32, the portion, of the insulating layer 49, that allows laser light to pass outward serves as a low reflectance layer 53. The low reflectance layer 53 is set to have a thickness and a refractive index that achieves reflectance that allows only the laser structure section 31B to perform laser oscillation and does not allow the temperature detection section 32 to perform laser oscillation when the same current is applied to the laser structure section 31B and the temperature detection section 32. Specifically, the low reflectance layer 53 has a thickness of $(2d-1)\lambda/4n_4$ ("d" is an integer of 1 or larger, and $n_4$ is a refractive index), and is configured of a material that has the refractive index $n_4$ higher than the refractive index of the top face of the semiconductor portion of the temperature detection section 32, for example, a dielectric body such as SiN (silicon nitride).

Figure 6:
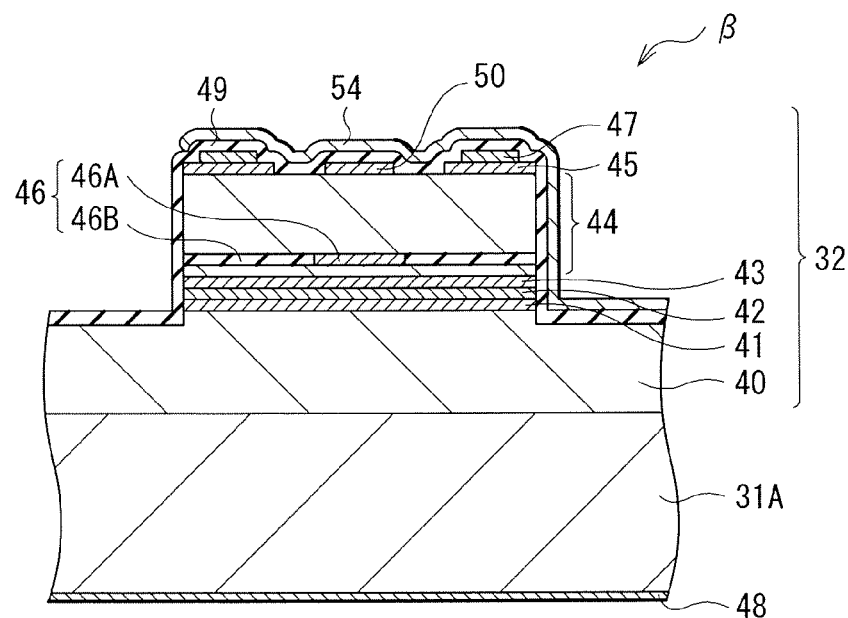
FIG. 6 is a diagram illustrating another example of the cross-sectional configuration of the temperature detection section shown in FIG. 1.

It is to be noted that the phase adjustment layer 50 may be provided also in the temperature detection section 32. However, in this case, laser oscillation occurs in the temperature detection section 32 and laser light is outputted to the outside. Therefore, for example, a metal layer 54 may be preferably provided over the top face as a whole of the temperature detection section 32 as shown in FIG. 6, so that the laser light is prevented from being leaked to the outside. Alternatively, the metal layer 54 may be provided over the top face as a whole of the temperature detection section 32 shown in FIG. 5, which is not illustrated. In such a case, even small light of an LED emission level is shielded by the metal layer 54. Therefore, the metal layer 54 may be preferably provided in application in which optical output with low noise is necessary.

The surface-emitting semiconductor laser usually performs laser oscillation with a current of about 3 mA. Also, the above-described laser structure section 31B performs laser oscillation with a current of about 3 mA independently from the existence or absence of the phase adjustment layer 50. On the other hand, the temperature detection section 32 is configured not to perform laser oscillation with a current about 3 mA due to the low reflectance layer 53 on the top face of the temperature detection section 32, although the semiconductor portion of the temperature section 32 has the same structure as that of the semiconductor portion of the laser structure section 31B. Therefore, the temperature detection section 32 retains a non-oscillation state even when a current of about 3 mA is applied thereto. Therefore, a resistance value of the temperature detection section 32 is stabilized at a value higher than that during oscillation. Accordingly, the variation in the voltage of the temperature detection section 32 is stabilized when the temperature of the substrate 31A or the ambient temperature of the semiconductor laser device 31 is varied and the voltage of the temperature detection section 32 is varied in accordance therewith.

Figure 7:
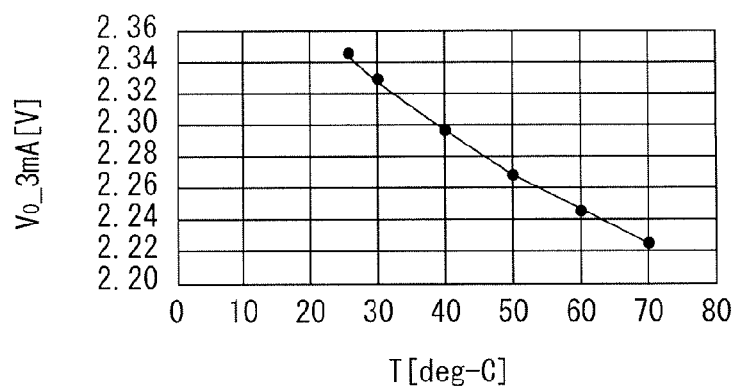
FIG. 7 is a diagram illustrating an example of output voltage characteristics of the temperature detection section shown in FIG. 1.

Under application of a constant current of about 3 mA to the temperature detection section 32, when the temperature of the substrate 31A or the ambient temperature of the semiconductor laser device 31 is varied, variation in voltage, for example, as shown in FIG. 7 may be caused in the temperature detection section 32. A slope of this variation in voltage is rarely varied between the respective temperature detection sections 32, and is almost constant. However, a value of the voltage itself may be varied between the respective temperature detection sections 32. This variations may be caused, for example because the resistance value of the temperature detection section 32 is varied with time due to application of a current to the temperature detection section 32 for a long time. Therefore, the temperature detection section 32 may be preferably driven in a manner that allows application of a current to the temperature detection section 32 to be as short as possible. A driver that drives the temperature detection section 32, a circuit (temperature monitoring circuit) that monitors a voltage outputted from the temperature detection section 32, etc. may be provided, for example, in the laser drive circuit 20.

Figure 8:
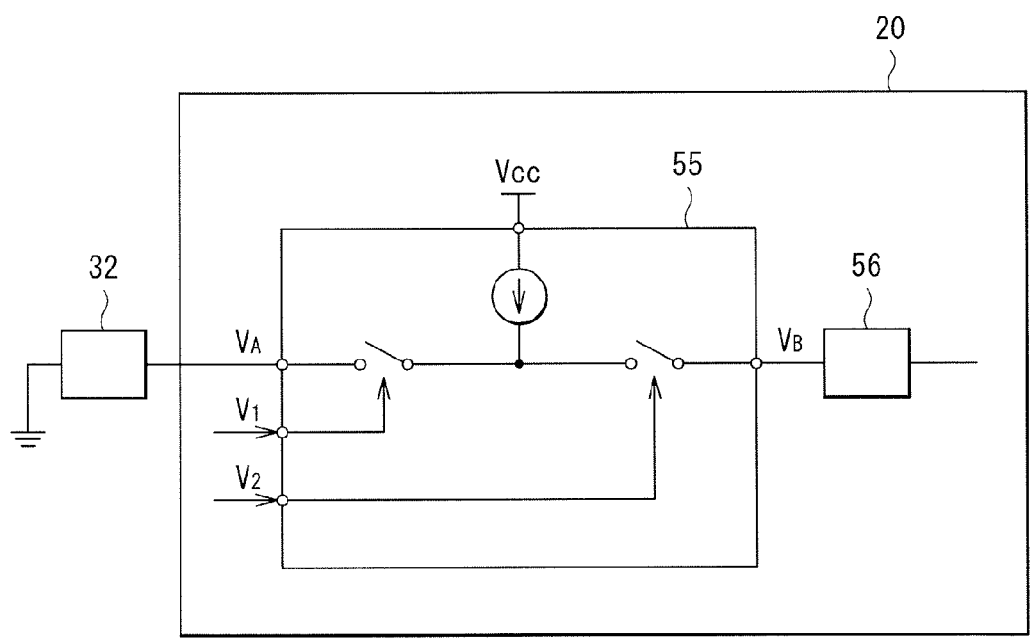
FIG. 8 is a diagram illustrating an example of a configuration of a driver that drives the temperature detection section shown in FIG. 1.
Figure 9:
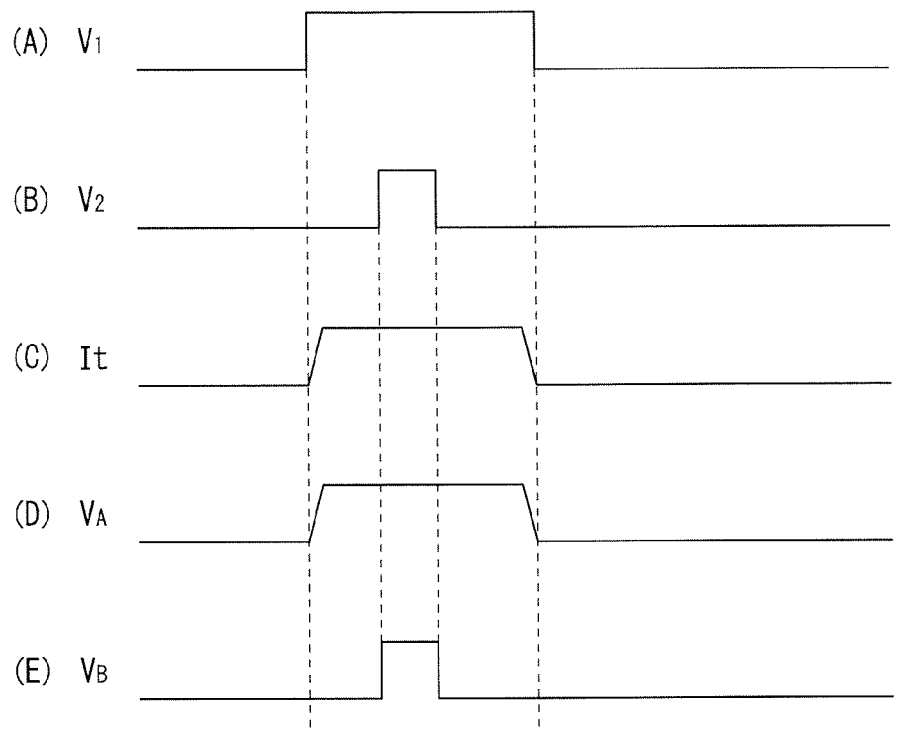
FIG. 9 is a diagram illustrating an example of an input and output waveform of a driver shown in FIG. 8.

FIG. 8 illustrates an example of a configuration of a driver 55 that drives the temperature detection section 32. FIG. 9 illustrates examples of waveforms of respective voltages $V_1$, $V_2$, $V_A$, and $V_B$ shown in FIG. 8 and also illustrates an example of a waveform of a current It that flows in the temperature detection section 32. The driver 55 may include, for example, two switches and a current source. The two switches are connected in series to each other. The current source has an output terminal connected between the switches. For example, first, the driver 55 may allow the switch on the temperature detection section 32 side to be closed in response to input of a pulse ($V_1$) for current drive, thereby supplying a current having predetermined magnitude (for example, 1 mA) to the temperature detection section 32. Immediately after this, the temperature detection section 32 outputs a voltage in accordance with the ambient temperature. After the voltage outputted from the temperature detection section 32 is stabilized (for example, 10 μs after applying the pulse ($V_1$)), the driver 55 inputs a pulse ($V_2$) for voltage sampling to allow the switch on the temperature monitoring circuit 56 side to be closed, thereby supplying the voltage outputted from the temperature detection section 32 to the temperature monitoring circuit 56. It is to be noted that the temperature monitoring circuit 56 determines ambient temperature T of the laser structure section 31B depending on the magnitude of the voltage outputted from the driver 55.

Figure 10:
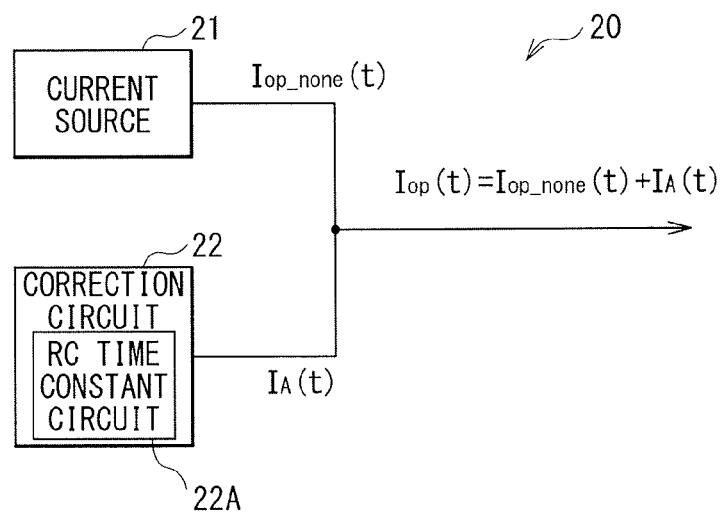
FIG. 10 is a diagram illustrating an example of a schematic configuration of a laser drive circuit shown in FIG. 1.

Next, description will be given of a driver for the laser structure section 31B provided in the laser drive circuit 20. The driver (hereinafter, simply referred to as "laser drive circuit 20") for the laser structure section 31B injects a current into the laser structure section 31B, thereby allowing the laser structure section 31B to emit light. The laser drive circuit 20 may include, for example, a current source 21 and a correction circuit 22 as shown in FIG. 10.

Figure 11A:
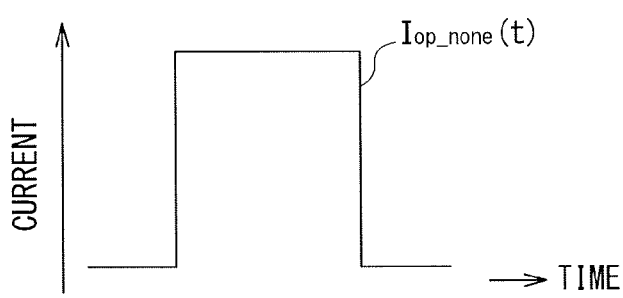
FIGS. 11A to 11C are diagrams each illustrating an example of a waveform of a current in the laser drive circuit shown in FIG. 1.

The current source 21 drives the laser structure section 31B in a pulsed manner. The current source 21 may output, for example, a rectangular current pulse (current $I_{op\text{-}none}(t)$) as shown in FIG. 11A. On the other hand, the correction circuit 22 outputs a current pulse (current $I_A(t)$) having a crest value that is processed to be a crest value of a predetermined waveform. The current $I_{op\text{-}none}(t)$ outputted from the current source 21 that drives the laser structure section 31B in a pulsed manner corresponds to a specific but not limitative example of "first current pulse" of the embodiment of the present technology. Further, the current $I_A(t)$ outputted from the correction circuit 22 corresponds to a specific but not limitative example of "second current pulse" of the embodiment of the present technology.

An output terminal of the current source 21 is connected to an output terminal of the correction circuit 22. The correction circuit 22 superposes the current pulse (current $I_A(t)$) on the current $I_{op\text{-}none}(t)$, thereby correcting a waveform of the current pulse (current $I_{op\text{-}none}(t)$). The correction circuit 22 performs such correction, thereby correcting the pulse waveform of the optical output of the laser structure section 31B to be closer to a rectangular shape. The correction circuit 22 includes an RC time constant circuit 22A. The correction circuit 22 corrects the waveform of the current $I_{op\text{-}none}(t)$ with the use of the RC time constant circuit 22A so that the pulse waveform of optical output of the laser structure section 31B to be closer to a rectangular shape. It is to be noted that the RC time constant circuit 22A corresponds to a specific but not limitative example of "first RC time constant circuit" of the embodiment of the present technology.

Figure 11B:
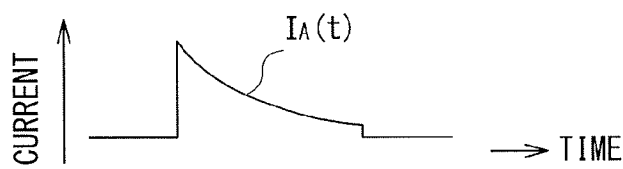

The RC time constant circuit 22A includes a plurality of first time constant circuits (not illustrated) that vary (attenuate) the crest value of the current $I_A(t)$ with time. The respective first time constant circuits have RC time constants different from one another. Specifically, each of one or more second time constant circuits (not illustrated) of the plurality of the first time constant circuits has an RC time constant that falls within a range from 10 nsec to 100 nsec both inclusive. On the other hand, each of one or more third time constant circuits (not illustrated) other than the one or more second time constant circuits of the plurality of the first time constant circuits has an RC time constant that is larger than 100 nsec (typically, from 30 nsec to 1500 nsec both inclusive). The correction circuit 22 attenuates the crest value of the current $I_A(t)$, with the use of the plurality of first time constant circuits, in accordance with the RC time constant of the RC time constant circuit. The correction circuit 22 may output, with the use of the above-described first time constant circuits, the current pulse (current $I_A(t)$) having the crest value attenuated with time, as shown in FIG. 11B, for example.

For example, it may be assumed that the RC time constant circuit 22A includes two first time constant circuits, and one (second time constant circuit) of the first time constant circuits has an RC time constant $T_{A1}$ that falls within a range from 10 nsec to 100 nsec both inclusive and the other (third time constant circuit) thereof has an RC time constant $T_{A2}$ that is larger than 100 nsec (typically, from 300 nsec to 1500 nsec both inclusive). In this case, the correction circuit 22 outputs the current $I_A(t)$ represented by Expression (1) below.

$$I_A(t) = I_{Amax} \cdot g(t) \tag{1}$$

In this example, $I_{Amax}$ is an initial crest value (crest value at the time of rising of $I_A(t)$) of $I_A(t)$. $g(t)$ defines attenuance at which the crest value of $I_A(t)$ is attenuated with time. $I_{Amax}$ is represented by Expression (2) below. $g(t)$ is represented by Expression (3) below.

$$I_{Amax} = (k - mT)(I_{sw} - I_{swo}) + I_{Ao} \tag{2}$$

$$g(t) = v \cdot \exp\left[-\frac{t}{T_{A1}}\right] + (1 - v) \cdot \exp\left[-\frac{t}{T_{A2}}\right] \tag{3}$$

$I_{sw}$ corresponds to $I_{op} - I_b$. $I_{op}$ is an operation current during DC drive, and corresponds to the crest value of the current $I_{op\text{-}none}(t)$ or to a current value set for output with respect to the current source 21. $I_b$ is a bias current. Therefore, $I_{sw}$ is a value that is correlated to the magnitude of the current $I_{op\text{-}none}(t)$. k, m, $I_{swo}$, and $I_{Ao}$ are each an initially-set value and are each a constant. In this example, m is a factor related to current confinement diameter of the laser structure section 31B and to the oscillation wavelength. k, $I_{swo}$, and $I_{Ao}$ are factors not correlated to the variations in the I-L characteristics of the respective laser structure sections 31B, and each are a fixed value that is given commonly to all of the laser structure sections 31B. It is to be noted that the values of k, $I_{swo}$, and $I_{Ao}$ may not be commonly given to all of the laser structure sections 31B when a laser structure section 31B having an epitaxial structure, a current confinement diameter, etc. that are largely different from those of other laser structure sections 31B.

k-mT defines a variation ratio in a case when $I_{sw}$ is proportional to $I_{Amax}$, and corresponds to a slope of a linear equation. In this example, T is the ambient temperature of the laser structure section 31B, and is a variable given by the temperature obtained by the temperature detection section 32. Therefore, Expression (1) refers to that the initial crest value ($I_{Amax}$) of the current $I_A(t)$ is increased by an amount larger as the magnitude ($I_{sw}$) of the current $I_{op\text{-}none}(t)$ is larger, and further, the amount by which the initial crest value ($I_{Amax}$) of the current $I_A(t)$ is increased is allowed to be smaller as the ambient temperature T of the laser structure section 31B is higher.

Figure 12:
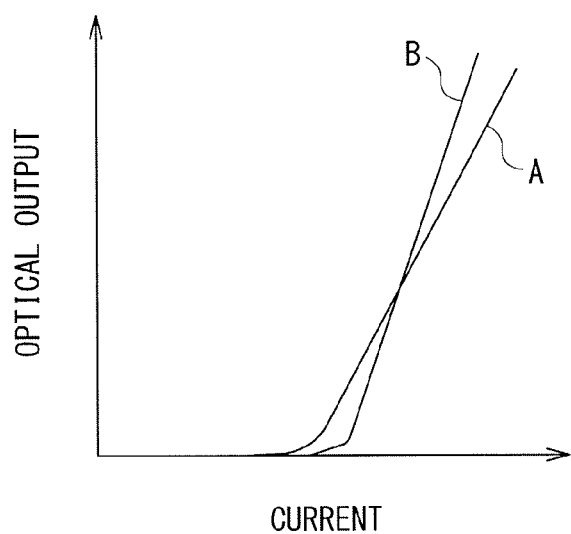
FIG. 12 is a diagram illustrating an example of I-L characteristics of the semiconductor laser device shown in FIG. 1.

In other words, in a case where the variations in the wavelength detuning Δλ that is the difference between the oscillation wavelength of the active layer 42 and the oscillation wavelength of the laser structure section 31B cause the variations in the I-L characteristics as shown by A and B in FIG. 12, which causes the variations in the magnitude of the necessary current $I_A(t)$, Expression (1) compensates the variations through adjusting the slope of the linear equation. Therefore, the correction circuit 22 adjusts the value of "k" in Expression (1), thereby varying the initial crest value ($I_{Amax}$) of the current $I_A(t)$ in accordance with the magnitude of the wavelength detuning $\Delta\lambda$. Further, the correction circuit 22 allows the current $I_A(t)$ to have the pulse waveform obtained through the correction based on Expression (1) (actually, with the use of the RC time constant circuit 22A) and outputs the current $I_A(t)$ having such a waveform pulse.

"v" is a weight on a term related to the RC time constant $T_{A1}$, and falls within a range from 0 to 1 both inclusive. In this example, "v" is a value larger than 0.5 since the RC time constant $T_{A1}$ is dominant in the current $I_A(t)$.

The RC time constant circuit 22A further includes a plurality of fourth time constant circuits (not illustrated) that adjust the initial crest value ($I_{Amax}$) of the current $I_A(t)$ when the current source 21 continuously outputs current pulses. The plurality of fourth time constant circuits are used to take into consideration thermal factors that are remained in the laser structure section 31B (in the active layer 42) when the current source 21 outputs a current pulse to allow the semiconductor laser to emit light. Thus, the correction circuit 22 varies the initial crest value ($I_{Amax}$) of the current $I_A(t)$ in accordance with the temperature variation in the active layer 42 with the use of the plurality of fourth time constant circuits.

The respective fourth time constant circuits have RC time constants that are different from one another. Specifically, each of one or more fifth time constant circuits (not illustrated) of the plurality of fourth time constant circuits has an RC time constant $T_{th1}$ that falls within a range from 10 nsec to 100 nsec both inclusive. On the other hand, each of one or more sixth time constant circuits (not illustrated) other than the one or more fifth time constant circuits of the plurality of fourth time constant circuits has an RC time constant $T_{th2}$ that is larger than 100 nsec (typically, from 300 nsec to 1500 nsec both inclusive).

For example, it may be assumed that the RC time constant circuit 22A includes two fourth time constant circuits, and one (fifth time constant circuit) of the fourth time constant circuits has the RC time constant $T_{th1}$ that falls within a range from 10 nsec to 100 nsec both inclusive, and the other (sixth time constant circuit) thereof has the RC time constant $T_{th2}$ that is larger than 100 nsec (typically from 300 nsec to 1500 nsec both inclusive). In this case, the correction circuit 22 outputs the current $I_A(t)$ represented by Expression (4) below.

$$I_A(t) = I_{Amax}(t) \cdot g(t) \quad (4)$$

$I_{Amax}(t)$ in Expression (4) is represented by Expression (5) below. $I_{Amax}(t)$ is the initial crest value (the crest value at the time of rising of $I_A(t)$) of the current $I_A(t)$. f(t) in Expression (5) is represented by Expression (6) below. f(t) represents variation corresponding to the variation in the thermal factors that remain in the laser structure section 31B (in the active layer 42). Therefore, the correction circuit 22 allows correction with high precision to be achieved as if the temperature variation in the active layer 42 is monitored in real time.

$$I_{Amax}(t) = \{(k - mT)(I_{SW} - I_{SWO}) + I_{AO}\}(1 - f(t)) \quad (5)$$

-continued $$\left.\begin{array}{l}\text{ON}\\ u \cdot \left[1 - \exp\left(-\dfrac{t}{T_{th1}}\right)\right] + (1-u) \cdot \left[1 - \exp\left(-\dfrac{t}{T_{th2}}\right)\right]\\ \text{OFF}\\ u \cdot \exp\left(-\dfrac{t}{T_{th1}}\right) + (1-u) \cdot \exp\left(-\dfrac{t}{T_{th2}}\right)\end{array}\right\} \equiv f(t) \quad (6)$$

"u" is a weight on a term related to the RC time constant $T_{th1}$, and falls within a range from 0 to 1 both inclusive. In this example, "u" is a value larger than 0.5 because the RC time constant $T_{th1}$ is dominant in the current $I_A(t)$. "t" included in the left-hand member of Expression (6) represents a start timing of an ON period or a start timing of an OFF period in ON-OFF drive of the laser structure section 31B.

Figure 11C:
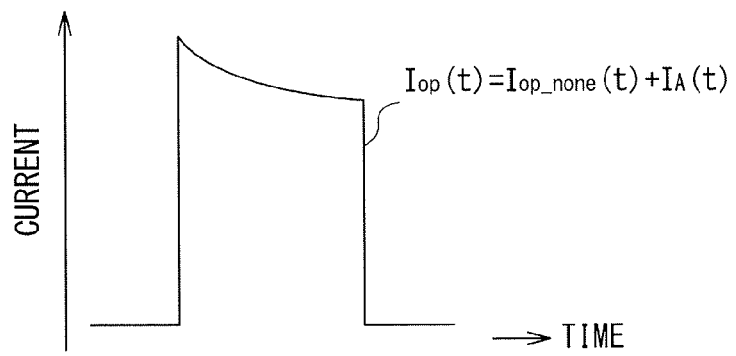
Figure 13A:
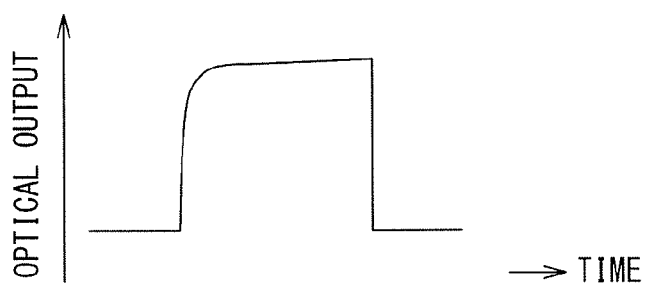
FIGS. 13A and 13B are diagrams each illustrating an example of a waveform of optical output of the semiconductor laser device shown in FIG. 1.
Figure 13B:
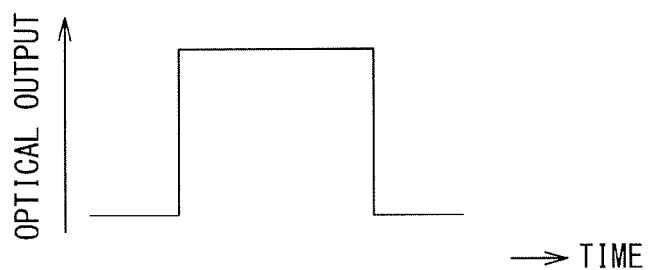

In the laser drive circuit 20, the output terminal of the current source 21 is connected to the output terminal of the correction circuit 22 as described above. Therefore, the laser drive circuit 20 outputs the current pulse ($I_{op}(t)=I_{op\text{-}none}(t) + I_A(t)$) in which the output of the correction circuit 22 is superposed on the output of the current source 21, as shown in FIG. 11C. Thus, for example, under application only of the output from the current source 21 to the laser structure section 31B, in the case where the pulse waveform of the optical output from the laser structure section 31B is dulled compared to the waveform of the current pulse outputted from the current source 21 as shown in FIG. 13A, for example, it is possible to allow the pulse waveform of the optical output from the laser structure 31B to be closer to a rectangular shape as shown in FIG. 13B through applying, to the laser structure section 31B, the current pulse in which the output from the correction circuit 22 is superposed on the output from the current source 21.

[Operation]

Figure 14:
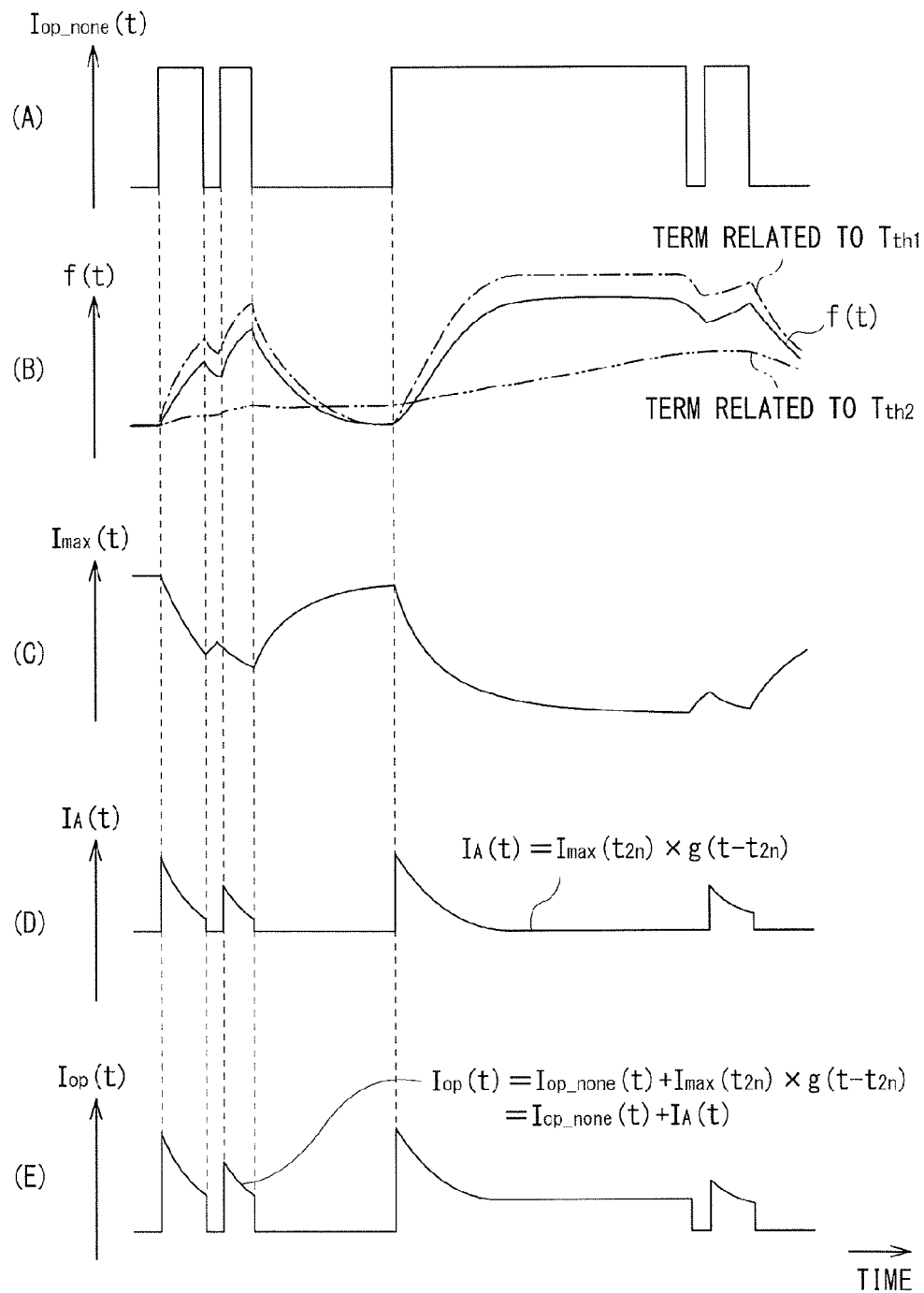
FIG. 14 is a waveform diagram illustrating an example of operation of the laser drive circuit shown in FIG. 1.

In the light emission unit 1 having such a configuration, the current source 21 outputs a rectangular current pulse (the current $I_{op\text{-}none}(t)$) (Part (A) of FIG. 14). At this time, the correction circuit 22 determines, with the use of the RC time constant circuit 22A, g(t) that defines the attenuance for attenuating the crest value of the current pulse (current $I_{op\text{-}none}(t)$) outputted from the current source 21 with time, f(t) representing the variation corresponding to the variation in the thermal factors that remain in the laser structure section 31B (in the active layer 42) (Part (B) of FIG. 14), and $I_{Amax}(t)$ that defines the maximum value of the current $I_A(t)$ (Part (C) of FIG. 14). At this time, the initial crest value ($I_{Amax}$) of the current $I_A(t)$ is increased by an amount that is larger as the magnitude ($I_{sw}$) of the current $I_{op\text{-}none}(t)$ is larger, and further, the amount by which the initial crest value ($I_{Amax}$) of the current $I_A(t)$ is increased is allowed to be smaller as the ambient temperature T of the laser structure section 31B is higher. Subsequently, the correction circuit 22 holds a value of $I_{max}(t_{2n})$ at the start timing of the ON period in ON-OFF drive of the laser structure section 31B. Further, the current $I_A(t)$ that is attenuated based on g(t) with the use of the held value as a starting point is determined (Part (D) of FIG. 14). Thereafter, the correction circuit 22 outputs the current $I_A(t)$. Subsequently, the laser drive circuit 20 superpose the output from the correction circuit 22 on the output from the current source 21, thereby correcting the output from the current source 21 to be the current pulse ($I_{op}(t)=I_{op\text{-}none}(t)+I_A(t)$). Subsequently, the current pulse ($I_{op}(t)=I_{op\text{-}none}(t)+I_A(t)$) is applied to the semiconductor laser device 31 (Part (E) of FIG. 14). Thus, the semiconductor laser device 31 may emit, for example, rectangular optical output as shown in FIG. 13B to the outside.

[Principle]

Figure 15:
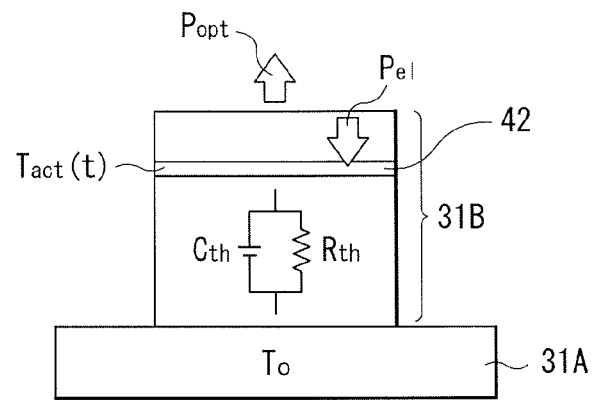
FIG. 15 is a diagram illustrating an example of a schematic configuration and a thermal circuit of the semiconductor laser device shown in FIG. 1.

Next, description will be given of one of the reasons why the pulse waveform of the optical output from the laser structure section 31B becomes closer to a rectangular shape. FIG. 15 illustrates a thermal circuit in the laser structure section 31B. Thermal equation related to active-layer temperature $T_{act}(t)$ is represented by Expressions (7) and (8) below, where $T_o$ is the temperature of the substrate 31A, $C_{th}$ is thermal capacity, $R_{th}$ is thermal resistance, $T_{act}(t)$ is the temperature (active-layer temperature) of the active layer 42 at any time t, $T_{e1}(t)$ is an amount of increase in the device temperature caused by a bias current (that is smaller than threshold current), $P_{e1}$ is injected energy, and $P_{out}$ is the optical output. $R_{th}C_{th}$ is a thermal time constant.

$$T_{act}(t) - T_o - (P_{e1} - P_{opt})R_{th} = -R_{th}C_{th}\frac{d}{dt}(T_{act}(t)) \quad (7)$$

$$T_{act}(t) - T_o - T_b = -R_{th}C_{th}\frac{d}{dt}(T_{act}(t)) \quad (8)$$

The above Expressions (7) and (8) may be solved to be modified as Expressions (9) and (10) below.

$$T_{act}(t) = T_o + (P_{e1} - P_{opt})R_{th}\left\{1 - \exp\left[\frac{t - t_{2n} + \tau}{R_{th}C_{th}}\right]\right\} \quad (9)$$

$$T_{act}(t) = T_o + T_b + (T_{2n+1} - T_o - T_o)\exp\left[-\frac{t - t_{2n+1}}{R_{th}C_{th}}\right] \quad (10)$$

Figure 16:
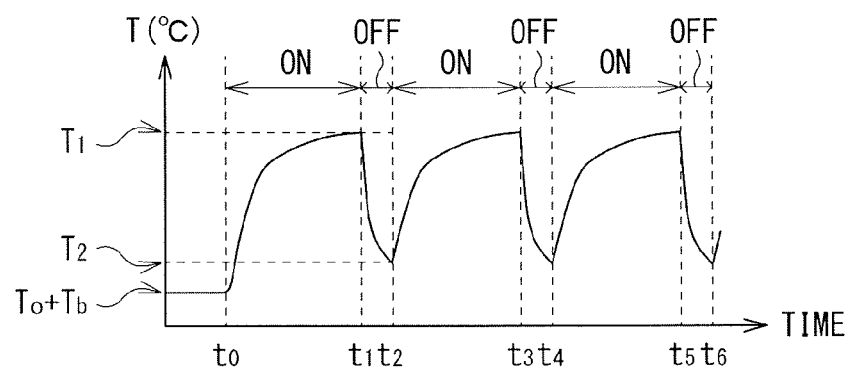
FIG. 16 is a waveform diagram for explaining variables included in a thermal equation.
Figure 17A:
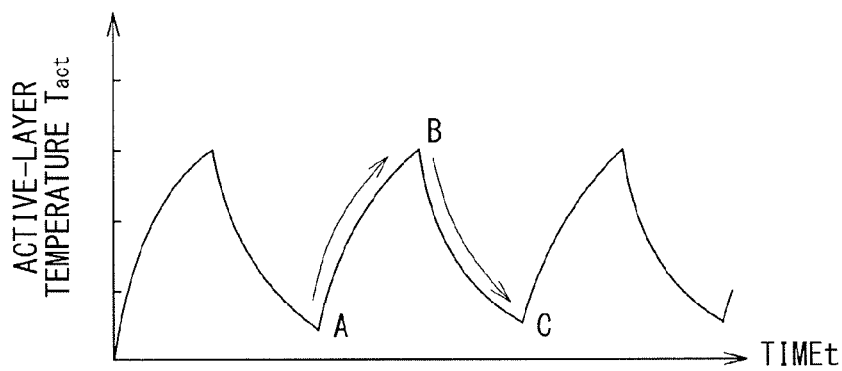
FIG. 17A is a diagram illustrating variation with time of temperature of an active layer obtained through solving the thermal equation.

$t_{2n}$, ("n" is an integer of 0 or larger) in Expression (9) represents the start timing of the ON period in ON-OFF drive of the laser structure section 31B as shown in FIG. 16. On the other hand, $t_{2n+1}$ in Expression (10) represents the start timing of the OFF period in ON-OFF drive of the laser structure section 31B as shown in FIG. 16. τ in Expression (9) is a coefficient to keep $T_{act}(t)$ in Expression (9) and $T_{act}(t)$ in Expression (10) to be continuous. It is to be noted that Expressions (9) and (10) are expressed in a graph as shown in FIG. 17A when the value of the thermal time constant $R_{th}C_{th}$ is 1 μsec.

In general, the surface-emitting semiconductor laser has an extremely small cavity length from about 1λ to 2λ (where λ is an oscillation wavelength). Therefore, the oscillation wavelength is fixed by the cavity length. Therefore, the laser structure section 31B is allowed to oscillate with a wavelength different from the emission wavelength (the wavelength achieving maximum gain) of the active layer 42. Accordingly, the device temperature that achieves minimum threshold current may be arbitrarily selected depending on design of the wavelength detuning Δλ. However, in practice, the device temperature that achieves the minimum threshold current may fall in a range within 0° C. to 60° C. both inclusive.

Figure 17B:
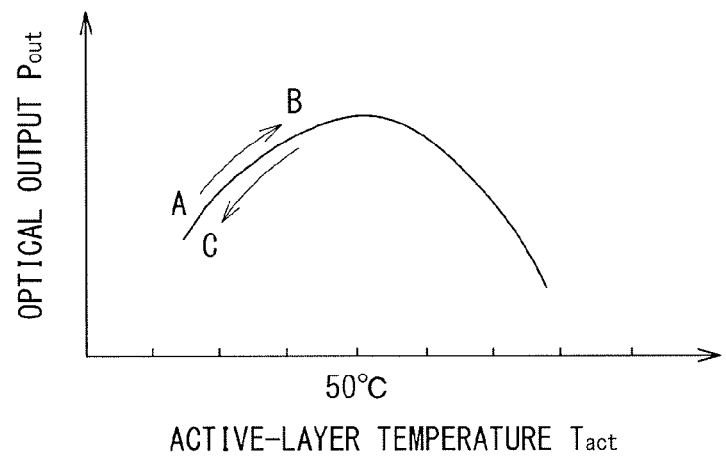
FIG. 17B is a diagram illustrating a relationship between optical output and the temperature of the active layer obtained through actual measurement.
Figure 17C:
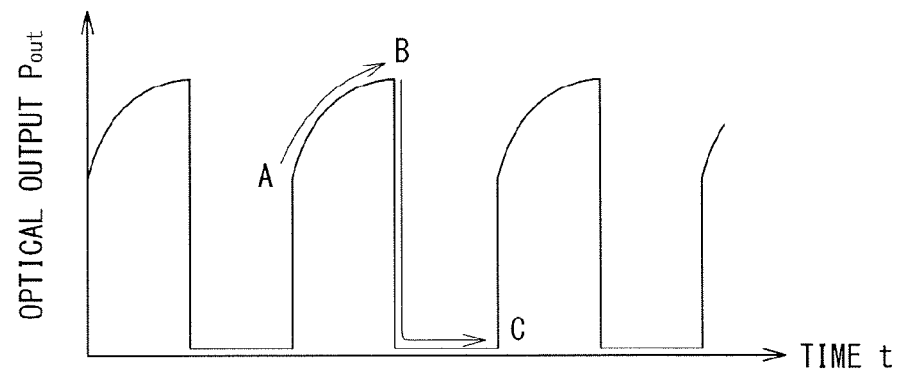
FIG. 17C is a diagram illustrating variation in the optical output over time obtained from FIGS. 17A and 17B.
Figure 18:
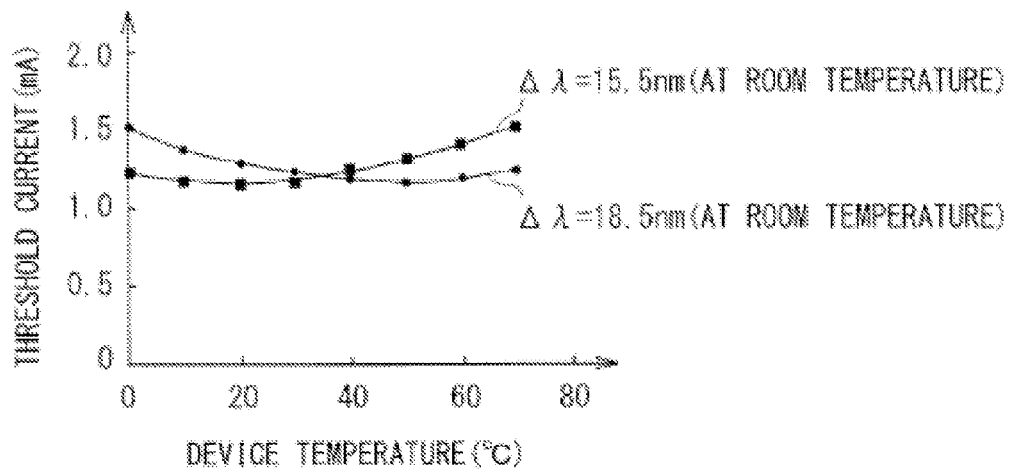
FIG. 18 is a diagram illustrating an example of a relationship between wavelength detuning and device temperature causing minimum threshold current.
Figure 19:
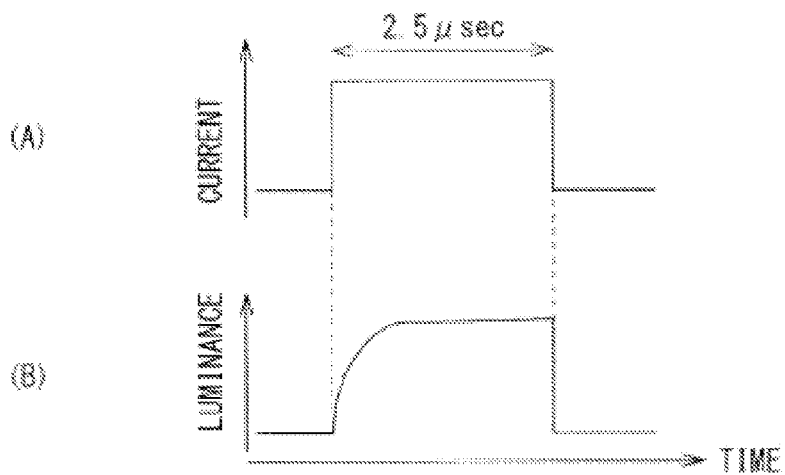
FIG. 19 is a diagram illustrating an example of a current pulse waveform and a pulse waveform of optical output.

In order to obtain sufficient optical output in a high-temperature range, it is necessary to design the wavelength detuning Δλ to be large. For example, in a surface-emitting semiconductor laser in a band from 660 nm to 680 nm in which the active layer 42 includes a material for red semiconductor lasers (GaInP or AlGaInP), the threshold current takes the minimum value when the device temperature $T_o$ is about 50° C. in a case where the wavelength detuning Δλ is designed to be about 18.5 nm (see FIG. 18). When the threshold current has dependency on temperature, optical output under a certain current value also has dependency on temperature (see FIG. 19). For example, as shown in FIG. 17B, in a surface-emitting semiconductor laser in which the wavelength detuning Δλ is designed to be 18.5 nm, the optical output becomes the maximum when the device temperature $T_o$ is about 50° C., and the optical output is decreased when the device temperature $T_o$ is higher or lower than 50° C. Variation in the optical output with time can be illustrated based thereon. As shown in FIGS. 17A to 17C, the active-layer temperature $T_{act}(t)$ is increased and the optical output $P_{out}$ is also increased when it moves from the point A to the point B. When it moves from the point B to the point C during a period in which the current is OFF, the active-layer temperature $T_{act}(t)$ is decreased and the optical output $P_{out}$ becomes zero at this timing.

Figure 20:
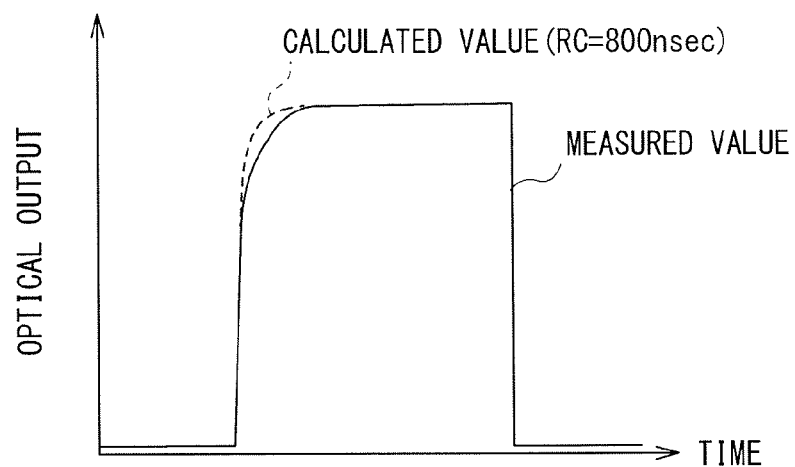
FIG. 20 is a diagram illustrating measured values and calculated values of variation in optical output with time.

In such a manner, the variation in the optical output $P_{out}$ with time is determined based on the thermal equation and the dependency of the optical output $P_{out}$ on the active-layer temperature. For example, as shown in FIG. 20, this result (calculated values) was compared with an optical waveform (measured values) obtained through actual measurement. It can be seen from the comparison that, when the thermal time constant $R_{th}C_{th}$ is 800 nsec, the calculated values coincide with the measured values at timings several hundred nsec or later from the rising of the pulse. However, the calculated values do not coincide with the measured values at the timing of the rising of the pulse. It can be seen that, at the timing of rising of the pulse, the thermal time constant $R_{th}C_{th}$ is varied at values smaller by one or more digits (from about 20 nsec to about 50 nsec both inclusive) than 800 nsec.

It is considered that two time constants exist in the optical waveform because a heat generation state after the rising of the pulse is different from a heat generation state at the timing of the rising of the pulse in the surface-emitting semiconductor laser. It is considered that, after the rising of the pulse, the mesa structure as a whole in the surface-emitting semiconductor laser generates heat, and therefore, the time constant is large. On the other hand, it is considered that, at the timing of the rising of the pulse, the active layer locally generates heat, and therefore, the time constant is small. The thermal equation is based on the premise that the mesa structure as a whole generates heat, and therefore, does not sufficiently express the optical waveform at the timing of the rising of the pulse in a precise manner.

[Effects]

In the present embodiment, as described above, the RC time constant circuit 22A in the correction circuit 22 includes a plurality of time constant circuits (the second time constant circuit and the third time constant circuit) that have different time constants from one another. Therefore, the waveform of the current pulse outputted from the current source 21 that drives the laser structure section 31B in a pulsed manner is corrected to allow the pulse waveform of the optical output of the semiconductor laser to be closer to a rectangular shape with the use of the correction circuit 22 including the RC time constant circuit 22A. In such a manner, in the present embodiment, using the RC time constant circuit 22A allows a portion that is curved drastically at the timing of rising to be closer to a rectangular shape in addition to the moderate slope portion after the rising of the waveform of the current pulse outputted from the current source 21. As a result, dullness in the waveform of the optical output caused by the wavelength detuning Δλ is reduced.

Moreover, in the present embodiment, the initial crest value of the current pulse outputted from the current source 21 is varied in accordance with the device temperature (ambient temperature) in the correction circuit 22. Therefore, it is possible to reduce the dullness in the waveform of the optical output even when the environment temperature (such as temperature in a housing of a printer) is varied due to variation in device temperature and the wavelength detuning Δλ is varied in accordance therewith.

Moreover, in the present embodiment, the initial crest value of the current pulse outputted from the current source 21 is varied in accordance with the variation in the temperature of the active layer 42 in the correction circuit 22. Therefore, the correction value for the crest value of the current pulse is allowed to be set at an appropriate value even when the current pulses are continuously outputted from the current source 21 and the thermal factors remain in the laser structure section 31B (in the active layer 42). As a result, it is possible to reduce dullness in the waveform of the optical output even when the current source 21 continuously outputs the current pulses.

Moreover, in the present embodiment, the values of "m", "k", and/or the like in Expression (2) are adjusted in the correction circuit 22, and thereby, it is possible to vary the initial crest value of the current pulse outputted from the current source 21 depending on the magnitude of the wavelength detuning Δλ. Which value is adjusted may be preferably determined by tendency in the variation in optical output with respect to the temperature variation. For example, it may be assumed that the current confinement diameter of the surface-emitting semiconductor laser is caused to be larger than a desirable value by variations in manufacturing. In this case, an amount of the variation in optical output with respect to the temperature variation is large (in other words, dependency of optical output on temperature is high). Therefore, the value of "m" by which the degree of influence of "T" in Expression (2) is adjustable may be preferably adjusted. Alternatively, for example, it may be assumed that the wavelength detuning Δλ of the surface-emitting semiconductor laser is caused to be large by the variations in manufacturing. In this case, the temperature causing the maximum optical output is shifted toward the high-temperature range (in other words, the dependency of optical output on temperature is shifted toward the high-temperature range). In this case, the value of "k" which is adjustable without being influenced by the temperature in Expression (2) may be preferably adjusted. In such a manner, in the present embodiment, the slope of Expression (2) is adjustable by selecting a preferable correction method based on the tendency of the variation in optical output with respect to the temperature variation. Therefore, dullness in the waveform of optical output is surely reduced.

2. Second Embodiment

Configuration

Figure 21:
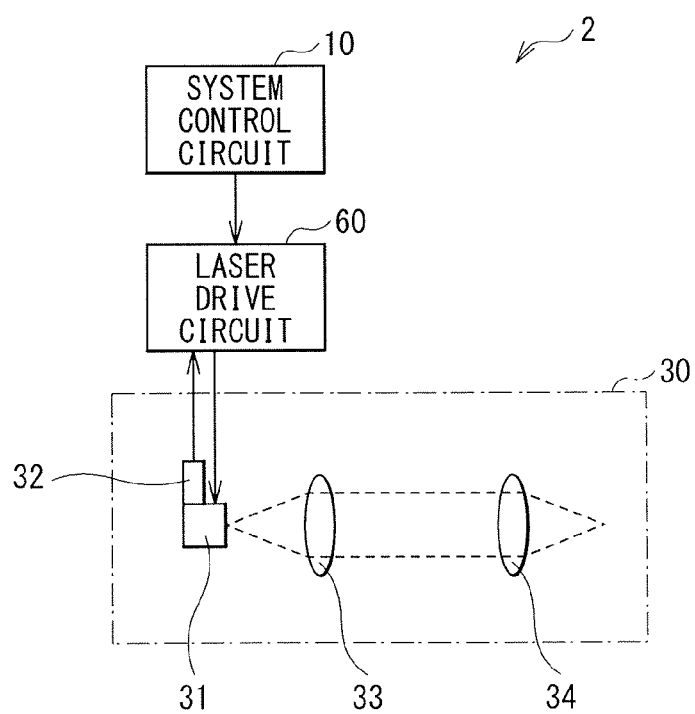
FIG. 21 is a diagram illustrating an example of a schematic configuration of a light emission unit according to a second embodiment of the present technology.

FIG. 21 illustrates an example of a schematic configuration of a light emission unit 2 according to a second embodiment of the present technology. The light emission unit 2 has a configuration different from that of the light emission unit 1 in that the light emission unit 2 includes a laser drive circuit 60 instead of the laser drive circuit 20. Therefore, the difference between the configuration of the light emission unit 2 and that of the light emission unit 1 will be mainly described below, and the description on common points therebetween will be omitted as appropriate.

Figure 22:
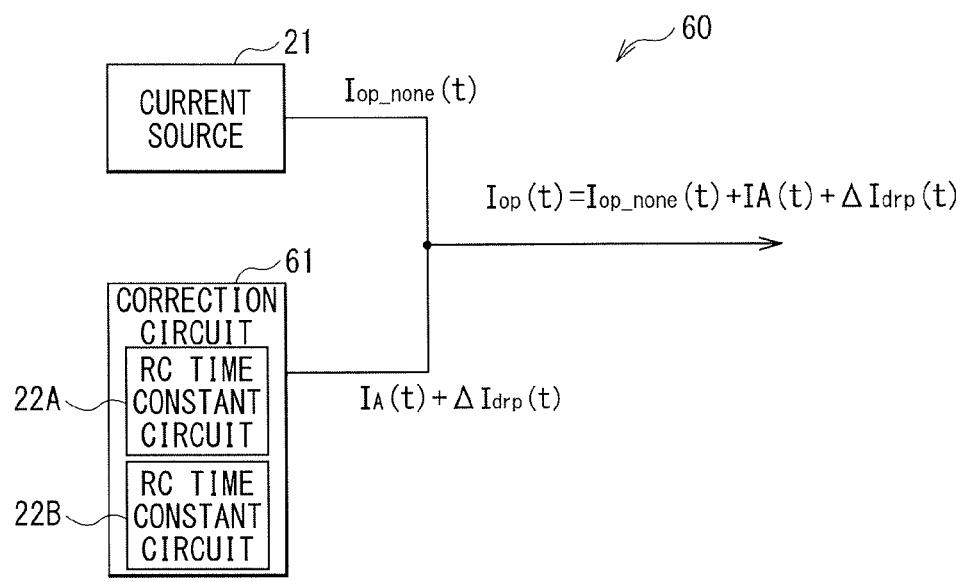
FIG. 22 is a diagram illustrating an example of a schematic configuration of a laser drive circuit shown in FIG. 21.
Figure 23A:
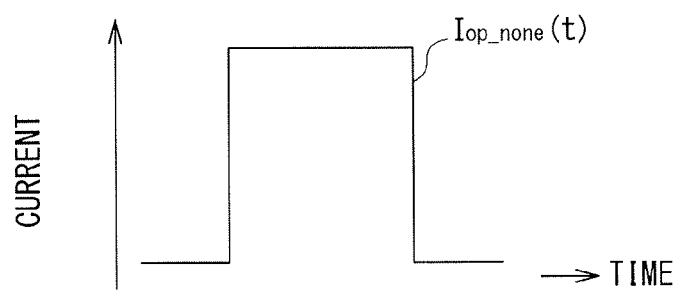
FIGS. 23A to 23C are diagrams each illustrating an example of a current waveform in the laser drive circuit shown in FIG. 21.

The laser drive circuit 60 may include, for example, the current source 21 and a correction circuit 61 as shown in FIG. 22. The current source 21 drives the laser structure section 31B in a pulsed manner, and may output, for example, a rectangular current pulse ($I_{op\text{-}none}(t)$) as shown in FIG. 23A. A crest value of the current pulse ($I_{op\text{-}none}(t)$) outputted from the current source 21 is a positive value.

The correction circuit 61 superposes a current pulse (current $I_A(t)+I_{drp}(t)$) on the current $I_{op\text{-}none}(t)$, thereby correcting the waveform of the current $I_{op\text{-}none}(t)$. The correction circuit 61 performs such correction, thereby correcting the pulse waveform of the optical output of the laser structure section 31B to be closer to a rectangular shape. The correction circuit 61 includes the RC time constant circuit 22A and an RC time constant circuit 22B. The correction circuit 61 corrects the waveform of the current $I_{op\text{-}none}(t)$ with the use of the RC time constant circuit 22A and the RC time constant circuit 22B so that the pulse waveform of optical output from the laser structure section 31B is closer to a rectangular shape. The RC time constant circuit 22B corresponds to a specific but not limitative example of "second RC time constant circuit" of the embodiment of the present technology. It is to be noted that, for the sake of simple understanding, first, description will be given below on correction (droop correction) by the RC time constant circuit 22B assuming that the correction by the RC time constant circuit 22A is not performed, and subsequently, description will be given below on the current circuit 61 in a case where the correction by the RC time constant circuit 22A and by the RC time constant circuit 22B is performed.

Figure 23B:
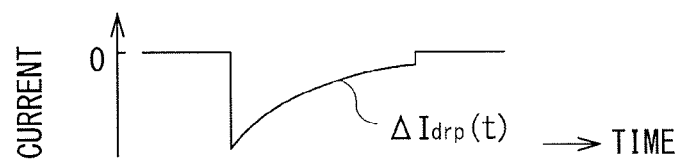
Figure 23C:
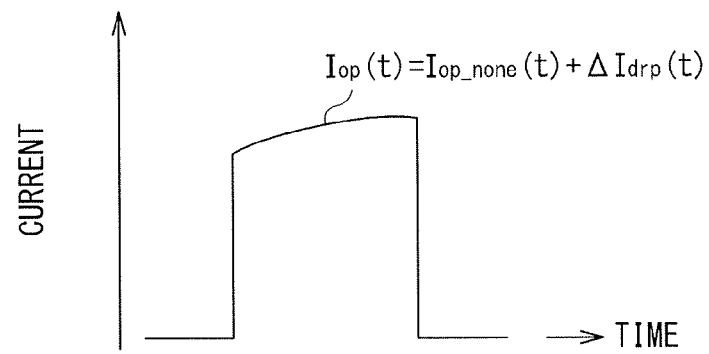

The correction circuit 61 may output, for example, a current pulse ($\Delta I_{drp}(t)$) that has a crest value having a sign (negative) opposite from the sign of the crest value of the current pulse ($I_{op\text{-}none}(t)$) with the use of the RC time constant circuit 22B as shown in FIG. 23B. The current pulse ($\Delta I_{drp}(t)$) may have, for example, a pulse waveform that is varied (saturated) with time in accordance with the RC time constant of the RC time constant circuit 22B as shown in FIG. 23B. Specifically, an absolute value of the crest value of the current pulse ($\Delta I_{drp}(t)$) is large at first, is decreased gradually, and becomes zero or a value close to zero at last. Further, a crest value of a waveform ($I_{op\text{-}none}(t)+\Delta I_{drp}(t)$) in which the waveform of the current pulse ($\Delta I_{drp}(t)$) is superposed on the waveform of the current pulse ($I_{op\text{-}none}(t)$) may be varied (saturated) with time in accordance with the RC time constant of the RC time constant circuit 22B as shown in FIG. 23C, for example.

The RC time constant circuit 22B includes a plurality of seventh time constant circuits (not illustrated) that vary (attenuate) the crest value of the current pulse ($\Delta I_{drp}(t)$) with time. The respective seventh time constant circuits have RC time constants different from one another. Specifically, each of one or more eighth time constant circuits of the plurality of seventh time constant circuits has an RC time constant that falls within a range from 300 nsec to 1000 nsec both inclusive. On the other hand, each of one or more ninth time constant circuits (not illustrated) other than the one or more eighth time constant circuits of the plurality of seventh time constant circuits has an RC time constant that is larger than 1000 nsec (typically, from 1000 nsec to 10000 nsec both inclusive). The correction circuit 61 corrects the crest value of the current pulse ($\Delta I_{drp}(t)$) with the use of the plurality of seventh time constant circuits so that the crest value of the current pulse ($\Delta I_{drp}(t)$) is varied (saturated) with time in accordance with the RC time constant of the seventh time constant circuits. The correction circuit 61 may output, with the use of the above-described seventh time constant circuits, the current pulse ($\Delta I_{drp}(t)$) having the crest value that is varied (saturated) with time as shown in FIG. 23B, for example.

For example, it may be assumed that the RC time constant circuit 22B includes two seventh time constant circuits, and one (eighth time constant circuit) of the seventh time constant circuits has an RC time constant $T_{A3}$ that falls within a range from 300 nsec to 1000 nsec both inclusive and the other (ninth time constant circuit) thereof has an RC time constant $T_{A4}$ that is larger than 1000 nsec (typically, from 1000 nsec to 10000 nsec both inclusive). In this case, the correction circuit 61 outputs the current pulse ($\Delta I_{drp}(t)$) represented by Expression (11) below.

$$\Delta I_{drp}(t) = \Delta I_{Amax\_drp} \cdot h(t) \tag{11}$$

In the above Expression (11), $\Delta I_{Amax\_drp}$ is an initial crest value of $\Delta I_{drp}(t)$ (a crest value at a timing of rising of $\Delta I_{drp}(t)$). h(t) defines attenuance at which the crest value of $\Delta I_{drp}(t)$ is attenuated with time. $\Delta I_{Amax\_drp}$ is represented by Expression (12) below. h(t) is represented by Expression (13) below.

$$\Delta I_{Amax\_drp} = -A \cdot (I_{op} - I_{dpo})^2 (I_{op} > I_{dpo}) \tag{12}$$
$$= 0 (0 \leq I_{op} \leq I_{dpo})$$

$$h(t) = u \cdot \exp\left(-\frac{t}{T_{A3}}\right) + (1-u) \cdot \exp\left(-\frac{t}{T_{A4}}\right) \tag{13}$$

$I_{op}$ is a drive current before correction, and corresponds to the crest value of the current $I_{op-none}(t)$ or to a current value set for output with respect to the current source 21. Therefore, $I_{op}$ is a value that is correlated to the magnitude of the current $I_{op-none}(t)$, and may be, for example, a value equivalent to that of the magnitude of the current $I_{op-none}(t)$. $I_{dpo}$ is a minimum operation current for which the droop correction is necessary. "A" corresponds to $C \cdot T - A_o$. "C" is a coefficient related to the ambient temperature T of the laser structure section 31B. $A_o$ is an adjustment parameter, and is varied based on I-L linearity of the laser structure section 31B, etc. Accordingly, Expression (12) refers to that the absolute value of the initial crest value ($\Delta I_{Amax\_drp}$) of $\Delta I_{drp}(t)$ is increased by an amount that is larger as the magnitude ($I_{op}$) of the current $I_{op-none}(t)$ is larger (specifically, is increased in proportion to the square of $I_{op}$), and further, the amount by which the absolute value of initial crest value ($\Delta I_{Amax\_drp}$) of $\Delta I_{drp}(t)$ is allowed to be larger as the ambient temperature T of the laser structure section 31B is higher.

The RC time constant circuit 22B further includes a plurality of tenth time constant circuits (not illustrated) that adjust the initial crest value ($\Delta I_{Amax\_drp}$) of $\Delta I_{drp}(t)$ when the current source 21 continuously outputs current pulses. The plurality of tenth time constant circuits are used to take into consideration thermal factors that remain in the laser structure section 31B (in the active layer 42) when the current source 21 outputs a current pulse to allow the laser structure section 31B to emit light. Thus, the correction circuit 61 varies the initial crest value ($\Delta I_{Amax\_drp}$) of $\Delta I_{drp}(t)$ in accordance with the temperature variation in the active layer 42 with the use of the tenth time constant circuits.

The respective tenth time constant circuits have RC time constants that are different from one another. Specifically, each of one or more eleventh time constant circuits (not illustrated) of the plurality of tenth time constant circuits has an RC time constant $T_{th3}$ that falls within a range from 300 nsec to 1000 nsec both inclusive. On the other hand, each of one or more twelfth time constant circuits (not illustrated) other than the one or more eleventh time constant circuits of the plurality of tenth time constant circuits has an RC time constant $T_{th4}$ that is larger than 1000 nsec (typically, from 1000 nsec to 10000 nsec both inclusive).

For example, it may be assumed that the RC time constant circuit 22B includes two tenth time constant circuits, and one (eleventh time constant circuit) of the tenth time constant circuits has the RC time constant $T_{th3}$ that falls within a range from 300 nsec to 1000 nsec both inclusive, and the other (twelfth time constant circuit) thereof has the RC time constant $T_{th4}$ that is larger than 1000 nsec (typically, from 1000 nsec to 10000 nsec both inclusive). In this case, the correction circuit 61 outputs the current pulse ($\Delta I_{drp}(t)$) represented by Expression (14) below. It is to be noted that $\Delta I_{Amax\_drp}(t)$ is an initial crest value of $\Delta I_{drp}(t)$ (the crest value at the timing of rising of $\Delta I_{drp}(t)$).

$$\Delta I_{drp}(t) = \Delta I_{Amax\_drp} \cdot h(t) \tag{14}$$

Figure 24:
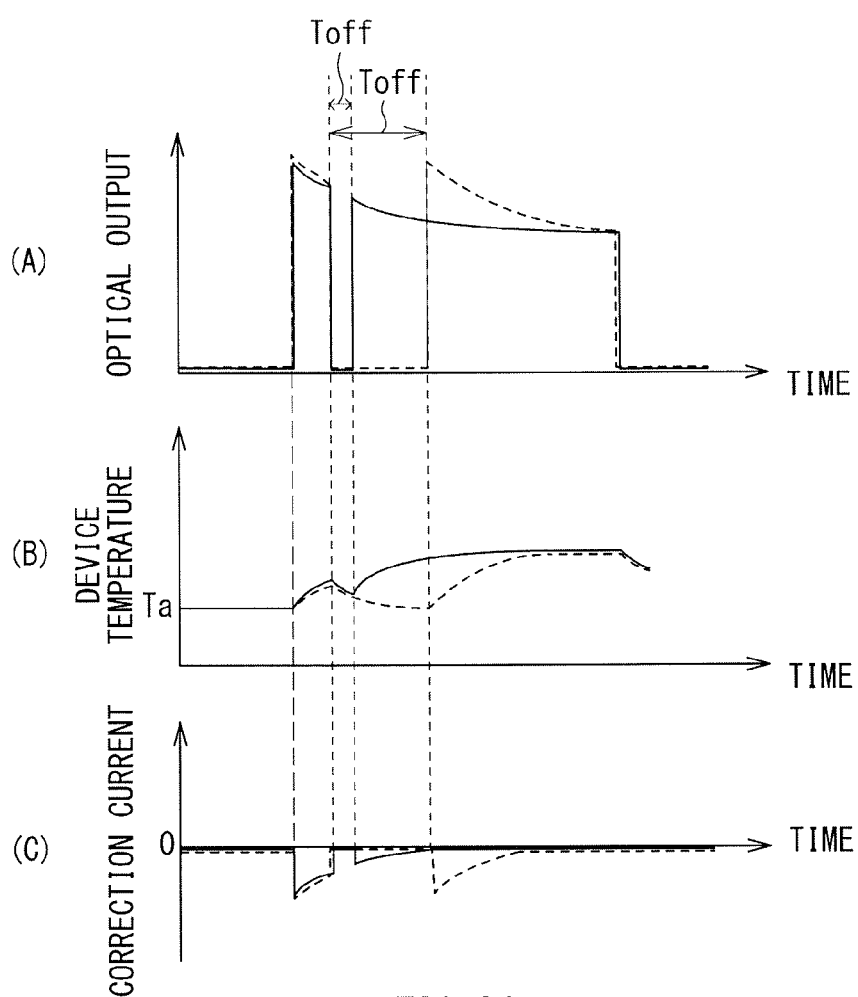
FIG. 24 is a waveform diagram illustrating an example of operation of the laser drive circuit shown in FIG. 21.

FIG. 24 illustrates an example of a relationship between optical output, device temperature, and correction current. As shown in FIG. 24, when a first pulse is inputted, the device temperature of the laser structure section 31B is increased due to self-heating. Next, a second pulse is inputted. At this time, the heat generated due to self-heating is released more to the outside as an OFF period $T_{off}$ from the timing at which the first pulse is inputted to the timing at which the second pulse is inputted is longer. Therefore, the device temperature of the laser structure section 31B becomes closer to the ambient temperature $T_a$. Therefore, as the OFF period $T_{off}$ is longer, the correction current to be supplied becomes larger (in a negative direction). Accordingly, the current $\Delta I_{Amax\_drp}(t)$ with respect to an arbitrary pulse pattern is represented by Expression (15) below. i(t) in Expression (15) is represented by Expression (16) below.

$$\Delta I_{Amax\_drp}(t) = -A \cdot (I_{op} - I_{dpo})(1 - i(t))(I_{op} > I_{dpo}) \tag{15}$$
$$= 0 (0 \leq I_{op} \leq I_{dpo})$$

$$\left.\begin{array}{l} \text{ON} \\ \theta \cdot \left[1 - \exp\left(-\frac{t}{T_{th3}}\right)\right] + (1-\theta) \cdot \left[1 - \exp\left(-\frac{t}{T_{th4}}\right)\right] \\ \text{OFF} \\ \theta \cdot \exp\left(-\frac{t}{T_{th3}}\right) + (1-\theta) \cdot \exp\left(-\frac{t}{T_{th4}}\right) \end{array}\right\} \equiv i(t) \tag{16}$$

$\theta$ is a weight on a term related to the RC time constant $T_{th3}$. "t" included in the left-hand member of Expression (16) represents a start timing of the ON period or a start timing of the OFF period in ON-OFF drive of the laser structure section 31B.

Next, description will be given on the correction circuit 61 in the case where the correction by the RC time constant circuit 22A and the RC time constant circuit 22B is performed. For example, the correction circuit 61 allows an output current pulse of the correction circuit 61 to have a current waveform (current $I_A(t) + I_{drp}(t)$) obtained through superposing the pulse waveform (current $\Delta I_{drp}(t)$) generated with the use of the RC time constant circuit 22B on the pulse waveform (current $I_A(t)$) generated with the use of the RC time constant circuit 22A, and outputs the output current pulse having the current waveform. At this time, the correction circuit 61 may actually superpose the current $\Delta I_{drp}(t)$ on the current $I_A(t)$, thereby generating the output current pulse of the correction circuit 61. It is to be noted that the correction circuit 61 may generate, from the beginning, the current waveform (current $I_A(t) + I_{drp}(t)$) formed through superposing the current $\Delta I_{drp}(t)$ on the current $I_A(t)$.

In this example, the current $I_A(t)$ has a waveform obtained through attenuating with time the crest value of the first pulse which is a positive crest value, increasing the initial crest value of the first pulse by an amount that is larger in the positive direction as the magnitude of the current $I_{op-none}(t)$ is larger, and allowing the amount by which the initial crest value of the first pulse is increased in the positive direction to be smaller as the ambient temperature T of the laser structure section 31B is higher. On the other hand, the current $\Delta I_{drp}(t)$ has a waveform obtained through attenuating with time the crest value of the second pulse which is a negative crest value, increasing the initial crest value of the second pulse in the negative direction by an amount that is larger as the magnitude of the current $I_{op\text{-}none}$ (t) is larger, and allowing the amount by which the initial crest value of the second pulse is increased in the negative direction to be larger as the ambient temperature T of the laser structure section 31B is higher.

In the laser drive circuit 60, the output terminal of the current source 21 may be connected to the output terminal of the correction circuit 61, as shown in FIG. 22, for example. Therefore, the laser drive circuit 60 outputs the current pulse ($I_{op}(t)=I_{op\text{-}none}(t)+I_A(t)+\Delta I_{drp}(t)$) in which the output from the correction circuit 61 is superposed on the output from the current source 21. Thus, for example, under application only of the output from the current source 21 to the laser structure section 31B, in the case where the pulse waveform of the optical output from the laser structure section 31B is dulled compared to the waveform of the current pulse outputted from the current source 21 as shown in FIG. 13A, for example, it is possible to allow the pulse waveform of the optical output from the laser structure 31B to be closer to a rectangular shape as shown in FIG. 13B through applying, to the laser structure section 31B, the current pulse in which the output from the correction circuit 61 is superposed on the output from the current source 21.

[Operation]

Figure 25:
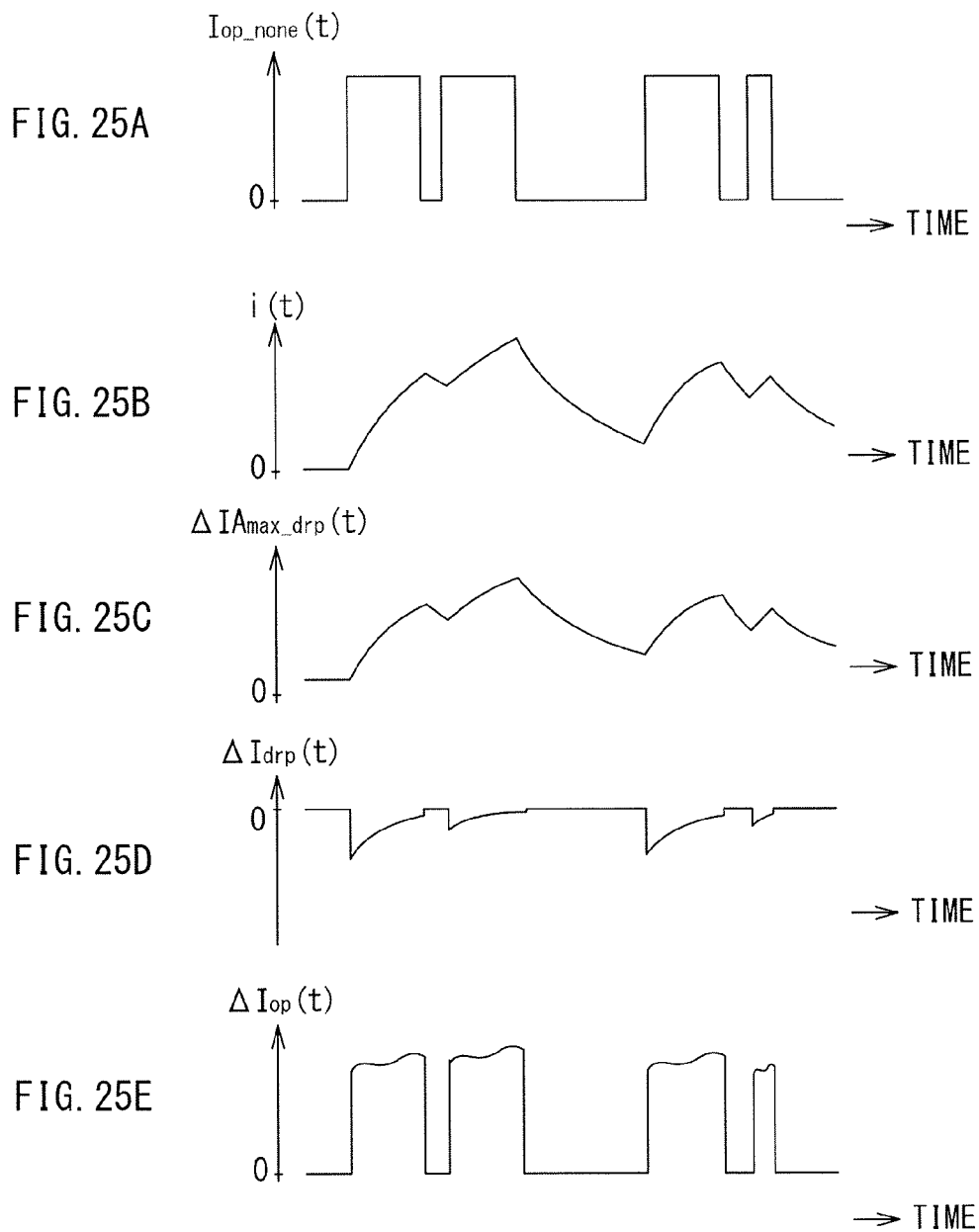
FIGS. 25A-25E are waveform diagrams illustrating another example of the operation of the laser drive circuit shown in FIG. 21.

In the light emission unit 2 having such a configuration, the current source 21 outputs a rectangular current pulse (the current $I_{op\text{-}none}(t)$) (FIG. 25A). At this time, the correction circuit 61 determines g(t), f(t), and $I_{Amax}$ (t) with the use of the RC time constant circuit 22A. Subsequently, the correction circuit 61 holds a value of $I_{Amax}(t_{2n})$ at the start timing ($I_{2n}$) of the ON period in ON-OFF drive of the laser structure section 31B. Further, the current $I_A(t)$ that is attenuated based on g(t) with the use of the held value as a starting point is determined. Further, the correction circuit 61 determines i(t) and $\Delta I_{Amax\_drp}(t)$ with the use of the RC time constant circuit 22B (FIGS. 25B and 25C). At this time, the absolute value of the initial crest value ($\Delta I_{Amax\_drp}$) of $\Delta I_{drp}(t)$ is increased by an amount that is larger as the magnitude ($I_{op}$) of the current $I_{op\text{-}none}(t)$ is larger (specifically, is increased in proportion to the square of $I_{op}$), and the amount by which the absolute value of the initial crest value ($\Delta I_{Amax\_drp}$) of $\Delta I_{drp}(t)$ is increased is allowed to be larger as the ambient temperature T of the laser structure section 31B is higher. Subsequently, the correction circuit 61 holds a value of $\Delta I_{Amax\_drp}(t)$ at the start timing ($t_{2n}$) of the ON period in ON-OFF drive of the laser structure section 31B. Further, the current $\Delta I_{drp}(t)$ that is attenuated based on h(t) with the use of the held value as a starting point is determined (FIG. 25D). Thereafter, the correction circuit 61 outputs the current pulse ($I_A(t)+\Delta I_{drp}(t)$). The output from the current source 21 is corrected through superposing $I_A(t)+\Delta I_{drp}(t)$ on the current $I_{op\text{-}none}(t)$ to generate the current pulse ($I_{op}(t)=I_{op\text{-}none}(t)+I_A(t)+\Delta I_{drp}(t)$). Subsequently, the laser drive circuit 60 outputs the current pulse ($I_{op}(t)=I_{op\text{-}none}(t)+I_A(t)+\Delta I_{drp}(t)$) to the laser structure section 31B (FIG. 25E).

[Effects]

Next, description will be given on effects of the light emission unit 2 of the present embodiment.

Typically, in the surface-emitting semiconductor laser, the resonator structure is extremely small, and therefore, increase in temperature of the active layer caused by current injection is large, and the optical output is decreased in accordance with the increase in temperature. For example, in a surface-emitting semiconductor laser having an oscillation wavelength of 680 nm, the optical output is decreased by about 20% when the ambient temperature is increased by 10° C. from a drive state of 50° C. and 1 mW. Also in a case where the surface-emitting semiconductor laser is operated in a pulsed manner, the temperature of the device is gradually increased at the same time as the current pulse is injected into the device, and the optical output is gradually decreased in accordance with the increase in temperature.

Figure 26:
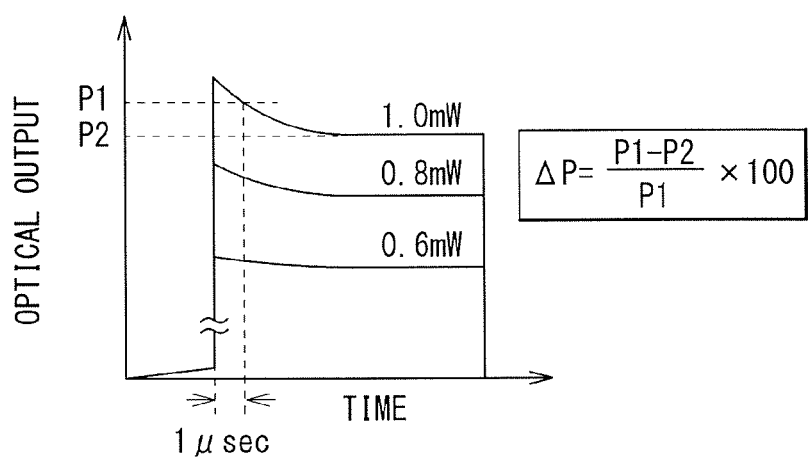
FIG. 26 is a diagram illustrating an example of dependency, of droop, on injected electric power.

This is a phenomenon called "droop" and is well known in semiconductor-laser field. This phenomenon is more remarkable as the injected electric power is larger. For example, as shown in FIG. 26, an amount of decrease in optical output is increased as the injected electric power is varied from 0.6 mW to 1 mW. For example, following expression is used when the droop is evaluated quantitatively.

$$\Delta P=(P1-P2)/P1\times 100(\%)$$

In the above-described expression, $\Delta P$ is an amount of droop (amount of decrease in optical output). P1 is the optical output at the timing 1 μsec after the rising, and P2 is the optical output at a timing when the optical output becomes a steady state. This droop may be corrected, for example, by a method disclosed in Japanese Unexamined Patent Application Publication No. 2002-254697 (JP 2002-254697A). Paragraph [0038] etc. in JP 2002-254697A discloses that "a heat generation amount is likely to depend more largely on the supplied current than on presence or absence of laser light emission. Therefore, when a bias current is continuously supplied, the amount of light is reduced along a similar envelope even when the light emission period is discontinuous." In the invention disclosed in JP 2002-254697A, correction based on this idea is performed.

Figure 27:
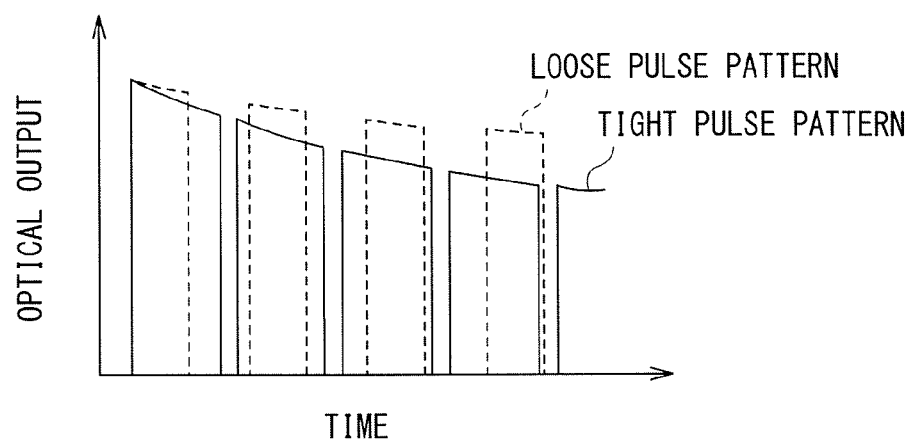
FIG. 27 is a diagram illustrating an example of a relationship between pulse-pattern density and a droop curve.

It is considered that the above-described idea is reasonable under a condition that the threshold value is large and the switching current is small. However, in actual drive, various pulse patterns may be used. Therefore, it may be preferably considered that the amount of heat generation depends on light emission pattern. In particular, in a low-threshold laser such as a surface-emitting semiconductor laser, it is not rare that a drive state in which the switching current is larger than the bias current is caused. In particular, when the semiconductor laser is driven under high-temperature environment, the switching current is large. Therefore, variation in the droop curve (optical output decrease curve) caused by light emission pattern is more remarkable. For example, as shown in FIG. 27, the droop curve may be decreased more as the pulse pattern is denser. As described above, precise correction of the droop has not been easy by the existing method also when the droop curve is varied depending on drive conditions such as light emission pattern, current values, and temperature.

On the other hand, in the present embodiment, the correction circuit 61 includes the seventh time constant circuit that attenuates with time the crest value of $\Delta I_{drp}(t)$ and the tenth time constant circuit that gives the initial crest value ($\Delta I_{Amax\_drp}(t)$) of $\Delta I_{drp}(t)$. Accordingly, the droop is corrected precisely even when the droop curve is varied depending on drive conditions such as light emission pattern, current values, and drive conditions such as temperature.

Moreover, in the present embodiment, the correction circuit 61 includes the first time constant circuit that attenuates with time the crest value of the current $I_A(t)$ and the fourth time constant circuit that gives the initial crest value ($\Delta I_{Amax\_drp}(t)$) of $\Delta I_{drp}(t)$. Accordingly, not only the dullness in the waveform caused by droop, but also dullness in the waveform of the optical output caused by the wavelength detuning $\Delta\lambda$ is reduced.

It is possible to achieve at least the following configurations from the above-described example embodiments and the modifications of the disclosure.
(1) A correction circuit including
a correction section configured to superpose a second current pulse on a first current pulse, and thereby correcting a waveform of the first current pulse, the first current pulse being output from a current source configured to drive a surface-emitting semiconductor laser in a pulsed manner,
the correction section being configured to allow the second current pulse to have a waveform obtained through attenuating a crest value of the second current pulse with time, increasing an initial crest value of the second current pulse by an amount that is larger as magnitude of the first current pulse is larger, and allowing the amount by which the initial crest value is increased to be smaller as ambient temperature of the semiconductor laser is higher, and being configured to output the second current pulse having the waveform.
(2) The correction circuit according to (1), wherein the initial crest value is represented by following expression, $$I_{Amax} = (k-mT)(I_{sw}-I_{swo})+I_{Ao}$$

where $I_{Amax}$ is the initial crest value,
k, m, $I_{swo}$, and $I_{Ao}$ are each a constant,
$I_{sw}$ is the magnitude of the first current pulse or a value correlated to the magnitude of the first current pulse, and
T is the ambient temperature of the semiconductor laser.
(3) The correction circuit according to (1) or (2), further including
a first RC time constant circuit, wherein
the correction section attenuates the crest value of the second current pulse with time in accordance with an RC time constant of the first RC time constant circuit.
(4) The correction circuit according to (3), wherein
the first RC time constant circuit includes a plurality of first time constant circuits each configured to attenuate the crest value of the second current pulse with time,
the respective plurality of first time constant circuits have RC time constants different from one another,
the plurality of first time constant circuits include one or more second time constant circuits and one or more third time constant circuits other than the one or more second time constant circuits,
each of the one or more second time constant circuits has an RC time constant that falls within a range from 10 nanoseconds to 100 nanoseconds both inclusive, and
each of the one or more third time constant circuits has an RC time constant that is larger than 100 nanoseconds.
(5) The correction circuit according to (4), wherein
the semiconductor laser has a vertical resonator structure including an active layer sandwiched by a pair of multilayer reflectors, and
the correction section is configured to allow the initial crest value to be varied in accordance with variation in temperature of the active layer.
(6) The correction circuit according to (5), wherein
the first RC time constant circuit includes a plurality of fourth time constant circuits each configured to vary the initial crest value,
the respective plurality of fourth constant circuits have RC time constants different from one another,
the plurality of fourth time constant circuits include one or more fifth time constant circuits and one or more sixth time constant circuits other than the one or more fifth time constant circuits,
each of the one or more fifth time constant circuits has an RC time constant that falls within a range from 10 nanoseconds to 100 nanoseconds both inclusive, and
each of the one or more sixth time constant circuits has an RC time constant that is larger than 100 nanoseconds.
(7) A correction circuit including
a correction section configured to superpose a second current pulse on a first current pulse, and thereby correcting a waveform of the first current pulse, the first current pulse being output from a current source configured to drive a surface-emitting semiconductor laser in a pulsed manner,
the correction section being configured to allow the second current pulse to have a waveform obtained through superposing a second pulse waveform on a first pulse waveform, and being configured to output the second current pulse having the waveform,
the first pulse waveform being obtained through attenuating with time a crest value of a first pulse that is a positive crest value, increasing an initial crest value of the first pulse in a positive direction by an amount that is larger as magnitude of the first current pulse is larger, and allowing the amount by which the initial crest value of the first pulse is increased in the positive direction to be smaller as the ambient temperature of the semiconductor laser is higher, and
the second pulse waveform being obtained through attenuating with time a crest value of a second pulse that is a negative crest value, increasing an initial crest value of the second pulse in a negative direction by an amount that is larger as the magnitude of the first current pulse is larger, and allowing the amount by which the initial crest value of the second pulse is increased in the negative direction to be larger as the ambient temperature of the semiconductor laser is higher.
(8) The correction circuit according to (7), wherein the initial crest value of the first pulse is represented by following expression, $$I_{Amax} = (k-mT)(I_{sw}-I_{swo})+I_{Ao}$$

where $I_{Amax}$ is the initial crest value of the first pulse,
k, m, $I_{swo}$, and $I_{Ao}$ are each a constant,
$I_{sw}$ is the magnitude of the first current pulse or a value correlated to the magnitude of the first current pulse, and
T is the ambient temperature of the semiconductor laser.
(9) The correction circuit according to (7) or (8), wherein the initial crest value of the second pulse is represented by following expression, $$I_{Amax\_drp} = -(C \cdot T - A_o)(I_{op} - I_{drp})^2$$

where $I_{Amax\_drp}$ is the initial crest value of the second pulse,
C, $A_o$, and $I_{drp}$ are each a constant, and
$I_{op}$ is the magnitude of the first current pulse or a value correlated to the magnitude of the first current pulse.
(10) The correction circuit according to any one of (7) to (9), further including
a second RC time constant circuit, wherein
the correction section attenuates the crest value of the second pulse with time in accordance with an RC time constant of the second RC time constant circuit.
(11) The correction circuit according to (10), wherein
the second RC time constant circuit includes a plurality of seventh time constant circuits each configured to attenuate the crest value of the second pulse with time,
the respective plurality of seventh time constant circuits have RC time constants different from one another, the plurality of seventh time constant circuits include one or more eighth time constant circuits and one or more ninth time constant circuits other than the one or more eighth time constant circuits,
    each of the one or more eighth time constant circuits has an RC time constant that falls within a range from 300 nanoseconds to 1000 nanoseconds both inclusive, and
    each of the one or more ninth time constant circuits has an RC time constant that is larger than 1000 nanoseconds.
(12) The correction circuit according to (11), wherein
    the semiconductor laser has a vertical resonator structure including an active layer sandwiched by a pair of multilayer reflectors, and
    the correction section is configured to allow the initial crest value of the second pulse to be varied in accordance with variation in temperature of the active layer.
(13) The correction circuit according to (12), wherein
    the second RC time constant circuit includes a plurality of tenth time constant circuits each configured to vary the initial crest value of the second pulse,
    the respective plurality of tenth time constant circuits have RC time constants different from one another,
    the plurality of tenth time constant circuits include one or more eleventh time constant circuits and one or more twelfth time constant circuits other than the one or more eleventh time constant circuits,
    each of the one or more eleventh time constant circuits has an RC time constant that falls within a range from 300 nanoseconds to 1000 nanoseconds both inclusive, and
    each of the one or more twelfth time constant circuits has an RC time constant that is larger than 1000 nanoseconds.
(14) A drive circuit including:
    a current source configured to drive a surface-emitting semiconductor laser in a pulsed manner; and
    a correction circuit configured to superpose a second current pulse on a first current pulse, and thereby correcting a waveform of the first current pulse, the first current pulse being output from the current source,
    the correction circuit being configured to allow the second current pulse to have a waveform obtained through attenuating a crest value of the second current pulse with time, increasing an initial crest value of the second current pulse by an amount that is larger as magnitude of the first current pulse is larger, and allowing the amount by which the initial crest value is increased to be smaller as ambient temperature of the semiconductor laser is higher, and being configured to output the second current pulse having the waveform.
(15) A drive circuit including:
    a current source configured to drive a surface-emitting semiconductor laser in a pulsed manner; and
    a correction circuit configured to superpose a second current pulse on a first current pulse, and thereby correcting a waveform of the first current pulse, the first current pulse being output from the current source,
    the correction circuit being configured to allow the second current pulse to have a waveform obtained through superposing a second pulse waveform on a first pulse waveform, and being configured to output the second current pulse having the waveform,
    the first pulse waveform being obtained through attenuating with time a crest value of a first pulse that is a positive crest value, increasing an initial crest value of the first pulse in a positive direction by an amount that is larger as magnitude of the first current pulse is larger, and allowing the amount by which the initial crest value of the first pulse is increased in the positive direction to be smaller as the ambient temperature of the semiconductor laser is higher, and
    the second pulse waveform being obtained through attenuating with time a crest value of a second pulse that is a negative crest value, increasing an initial crest value of the second pulse in a negative direction by an amount that is larger as the magnitude of the first current pulse is larger, and allowing the amount by which the initial crest value of the second pulse is increased in the negative direction to be larger as the ambient temperature of the semiconductor laser is higher.
(16) A light emission unit including:
    one or more surface-emitting semiconductor lasers;
    a current source configured to drive the one or more surface-emitting semiconductor lasers in a pulsed manner; and
    a correction circuit configured to superpose a second current pulse on a first current pulse, and thereby correcting a waveform of the first current pulse, the first current pulse being output from the current source,
    the correction circuit being configured to allow the second current pulse to have a waveform obtained through attenuating a crest value of the second current pulse with time, increasing an initial crest value of the second current pulse by an amount that is larger as magnitude of the first current pulse is larger, and allowing the amount by which the initial crest value is increased to be smaller as ambient temperature of the semiconductor laser is higher, and being configured to output the second current pulse having the waveform.
(17) A light emission unit including:
    one or more surface-emitting semiconductor lasers;
    a current source configured to drive the one or more surface-emitting semiconductor lasers in a pulsed manner; and
    a correction circuit configured to superpose a second current pulse on a first current pulse, and thereby correcting a waveform of the first current pulse, the first current pulse being output from the current source,
    the correction circuit being configured to allow the second current pulse to have a waveform obtained through superposing a second pulse waveform on a first pulse waveform, and being configured to output the second current pulse having the waveform,
    the first pulse waveform being obtained through attenuating with time a crest value of a first pulse that is a positive crest value, increasing an initial crest value of the first pulse in a positive direction by an amount that is larger as magnitude of the first current pulse is larger, and allowing the amount by which the initial crest value of the first pulse is increased in the positive direction to be smaller as the ambient temperature of the semiconductor laser is higher, and
    the second pulse waveform being obtained through attenuating with time a crest value of a second pulse that is a negative crest value, increasing an initial crest value of the second pulse in a negative direction by an amount that is larger as the magnitude of the first current pulse is larger, and allowing the amount by which the initial crest value of the second pulse is increased in the negative direction to be larger as the ambient temperature of the semiconductor laser is higher.
(18) A method of correcting a current pulse waveform, the method including:
    superposing a second current pulse on a first current pulse, and thereby correcting a waveform of the first current pulse, the first current pulse being output from a current source configured to drive a surface-emitting semiconductor laser in a pulsed manner; and in the correcting of the waveform of the first current pulse, generating the second current pulse through attenuating a crest value of the second current pulse with time, increasing an initial crest value of the second current pulse by an amount that is larger as magnitude of the first current pulse is larger, and allowing the amount by which the initial crest value is increased to be smaller as ambient temperature of the semiconductor laser is higher.

(19) A method of correcting a current pulse waveform, the method including:

superposing a second current pulse on a first current pulse, and thereby correcting a waveform of the first current pulse, the first current pulse being output from a current source configured to drive a surface-emitting semiconductor laser in a pulsed manner; and in the correcting the waveform of the first current pulse, generating the second current pulse through superposing a second pulse waveform on a first pulse waveform, the first pulse waveform being obtained through attenuating with time a crest value of a first pulse that is a positive crest value, increasing an initial crest value of the first pulse in a positive direction by an amount that is larger as magnitude of the first current pulse is larger, and allowing the amount by which the initial crest value of the first pulse is increased in the positive direction to be smaller as the ambient temperature of the semiconductor laser is higher, and the second pulse waveform being obtained through attenuating with time a crest value of a second pulse that is a negative crest value, increasing an initial crest value of the second pulse in a negative direction by an amount that is larger as the magnitude of the first current pulse is larger, and allowing the amount by which the initial crest value of the second pulse is increased in the negative direction to be larger as the ambient temperature of the semiconductor laser is higher.

It should be understood by those skilled in the art that various modifications, combinations, sub-combinations, and alterations may occur depending on design requirements and other factors insofar as they are within the scope of the appended claims or the equivalents thereof.

What is claimed is:

1. A correction circuit comprising:
   a correction section configured to:
      superpose a second current pulse on a first current pulse to correct a waveform of the first current pulse, the first current pulse being output from a current source configured to drive a surface-emitting semiconductor laser in a pulsed manner;
      allow the second current pulse to have a waveform obtained through attenuating a crest value of the second current pulse with time;
      increase an initial crest value of the second current pulse by an amount based on square of the magnitude of the first current pulse or square of a value correlated to the magnitude of the first current pulse;
      allow the amount by which the initial crest value is increased to be smaller as ambient temperature of the surface-emitting semiconductor laser is higher; and
      output the second current pulse having the waveform.

2. The correction circuit according to claim 1, wherein the initial crest value is represented by following expression, $$I_{Amax}=(k-mT)(I_{sw}-I_{swo})+I_{Ao}$$

where $I_{Amax}$ is the initial crest value,
k, m, $I_{swo}$, and $I_{Ao}$ are each a constant,
$I_{sw}$ is the magnitude of the first current pulse or the value correlated to the magnitude of the first current pulse, and
T is the ambient temperature of the surface-emitting semiconductor laser.

3. The correction circuit according to claim 2, further comprising a first RC time constant circuit, wherein the correction section attenuates the crest value of the second current pulse with time in accordance with an RC time constant of the first RC time constant circuit.

4. The correction circuit according to claim 3, wherein the first RC time constant circuit includes a plurality of first time constant circuits each configured to attenuate the crest value of the second current pulse with time, the respective plurality of first time constant circuits have RC time constants different from one another, the plurality of first time constant circuits include one or more second time constant circuits and one or more third time constant circuits other than the one or more second time constant circuits,
   each of the one or more second time constant circuits has an RC time constant that falls within a range from 10 nanoseconds to 100 nanoseconds both inclusive, and
   each of the one or more third time constant circuits has an RC time constant that is larger than 100 nanoseconds.

5. The correction circuit according to claim 4, wherein the surface-emitting semiconductor laser has a vertical resonator structure including an active layer sandwiched by a pair of multilayer reflectors, and the correction section is configured to allow the initial crest value to be varied in accordance with variation in temperature of the active layer.

6. The correction circuit according to claim 5, wherein
   the first RC time constant circuit includes a plurality of fourth time constant circuits each configured to vary the initial crest value,
   the respective plurality of fourth constant circuits have RC time constants different from one another,
   the plurality of fourth time constant circuits include one or more fifth time constant circuits and one or more sixth time constant circuits other than the one or more fifth time constant circuits,
   each of the one or more fifth time constant circuits has an RC time constant that falls within a range from 10 nanoseconds to 100 nanoseconds both inclusive, and
   each of the one or more sixth time constant circuits has an RC time constant that is larger than 100 nanoseconds.

7. A correction circuit comprising:
   a correction section configured to:
      superpose a second current pulse on a first current pulse to correct a waveform of the first current pulse, the first current pulse being output from a current source configured to drive a surface-emitting semiconductor laser in a pulsed manner;
      allow the second current pulse to have a waveform obtained through superposing a second pulse waveform on a first pulse waveform, and output the second current pulse having the waveform, the first pulse waveform being obtained through attenuating with time a crest value of a first pulse that is a positive crest value;
      increase an initial crest value of the first pulse in a positive direction by an amount that is larger as magnitude of the first current pulse is larger;

allow the amount by which the initial crest value of the first pulse is increased in the positive direction to be smaller as the ambient temperature of the surface-emitting semiconductor laser is higher, the second pulse waveform being obtained through attenuating with time a crest value of a second pulse that is a negative crest value, wherein the initial crest value of the first pulse is represented by following expression, $$I_{Amax}=(k-mT)(I_{sw}-I_{swo})+I_{Ao}$$

where $I_{Amax}$ is the initial crest value of the first pulse, k, m, $I_{swo}$, and $I_{Ao}$ are each a constant, $I_{sw}$ is the magnitude of the first current pulse or the value correlated to the magnitude of the first current pulse, and T is the ambient temperature of the surface-emitting semiconductor laser;

increase an initial crest value of the second pulse in a negative direction by an amount that is larger as the magnitude of the first current pulse is larger; and allow the amount by which the initial crest value of the second pulse is increased in the negative direction to be larger as the ambient temperature of the surface-emitting semiconductor laser is higher, wherein the initial crest value of the second pulse is represented by following expression, $$I_{Amax\_drp}=-(C\cdot T-A_o)(I_{op}-I_{drp})^2$$

where $I_{Amax\_drp}$ is the initial crest value of the second pulse,

C, $A_o$, and $I_{drp}$ are each a constant, and $I_{op}$ is the magnitude of the first current pulse or a value correlated to the magnitude of the first current pulse.

8. The correction circuit according to claim 7, further comprising a second RC time constant circuit, wherein the correction section attenuates the crest value of the second pulse with time in accordance with an RC time constant of the second RC time constant circuit.

9. The correction circuit according to claim 8, wherein the second RC time constant circuit includes a plurality of seventh time constant circuits each configured to attenuate the crest value of the second pulse with time, the respective plurality of seventh time constant circuits have RC time constants different from one another, the plurality of seventh time constant circuits include one or more eighth time constant circuits and one or more ninth time constant circuits other than the one or more eighth time constant circuits, each of the one or more eighth time constant circuits has an RC time constant that falls within a range from 300 nanoseconds to 1000 nanoseconds both inclusive, and each of the one or more ninth time constant circuits has an RC time constant that is larger than 1000 nanoseconds.

10. The correction circuit according to claim 9, wherein the surface-emitting semiconductor laser has a vertical resonator structure including an active layer sandwiched by a pair of multilayer reflectors, and the correction section is configured to allow the initial crest value of the second pulse to be varied in accordance with variation in temperature of the active layer.

11. The correction circuit according to claim 10, wherein the second RC time constant circuit includes a plurality of tenth time constant circuits each configured to vary the initial crest value of the second pulse, the respective plurality of tenth time constant circuits have RC time constants different from one another, the plurality of tenth time constant circuits include one or more eleventh time constant circuits and one or more twelfth time constant circuits other than the one or more eleventh time constant circuits, each of the one or more eleventh time constant circuits has an RC time constant that falls within a range from 300 nanoseconds to 1000 nanoseconds both inclusive, and each of the one or more twelfth time constant circuits has an RC time constant that is larger than 1000 nanoseconds.

12. A drive circuit comprising:

a current source configured to drive a surface-emitting semiconductor laser in a pulsed manner; and a correction circuit configured to:

superpose a second current pulse on a first current pulse to correct a waveform of the first current pulse, the first current pulse being output from the current source;

allow the second current pulse to have a waveform obtained through attenuating a crest value of the second current pulse with time;

increase an initial crest value of the second current pulse by an amount based on square of the magnitude of the first current pulse or square of a value correlated to the magnitude of the first current pulse;

allow the amount by which the initial crest value is increased to be smaller as ambient temperature of the surface-emitting semiconductor laser is higher;

output the second current pulse having the waveform.

13. A drive circuit comprising:

a current source configured to drive a surface-emitting semiconductor laser in a pulsed manner; and a correction circuit configured to:

superpose a second current pulse on a first current pulse to correct a waveform of the first current pulse, the first current pulse being output from the current source;

allow the second current pulse to have a waveform obtained through superposing a second pulse waveform on a first pulse waveform, and output the second current pulse having the waveform, the first pulse waveform being obtained through attenuating with time a crest value of a first pulse that is a positive crest value;

increase an initial crest value of the first pulse in a positive direction by an amount that is larger as magnitude of the first current pulse is larger;

allow the amount by which the initial crest value of the first pulse is increased in the positive direction to be smaller as the ambient temperature of the surface-emitting semiconductor laser is higher, the second pulse waveform being obtained through attenuating with time a crest value of a second pulse that is a negative crest value;

increase an initial crest value of the second pulse in a negative direction by an amount based on square of the magnitude of the first current pulse or square of a value correlated to the magnitude of the first current pulse; and allow the amount by which the initial crest value of the second pulse is increased in the negative direction to be larger as the ambient temperature of the surface-emitting semiconductor laser is higher.

14. A light emission unit comprising:
one or more surface-emitting semiconductor lasers;
a current source configured to drive the one or more surface-emitting semiconductor lasers in a pulsed manner; and
a correction circuit configured to:
- superpose a second current pulse on a first current pulse to correct a waveform of the first current pulse, the first current pulse being output from the current source;
- allow the second current pulse to have a waveform obtained through attenuating a crest value of the second current pulse with time;
- increase an initial crest value of the second current pulse by an amount based on square of the magnitude of the first current pulse or square of a value correlated to the magnitude of the first current pulse;
- allow the amount by which the initial crest value is increased to be smaller as ambient temperature of the one or more surface-emitting semiconductor lasers is higher; and
- output the second current pulse having the waveform.

15. A light emission unit comprising:
one or more surface-emitting semiconductor lasers;
a current source configured to drive the one or more surface-emitting semiconductor lasers in a pulsed manner; and
a correction circuit configured to:
- superpose a second current pulse on a first current pulse to correct a waveform of the first current pulse, the first current pulse being output from the current source;
- allow the second current pulse to have a waveform obtained through superposing a second pulse waveform on a first pulse waveform, and output the second current pulse having the waveform, the first pulse waveform being obtained through attenuating with time a crest value of a first pulse that is a positive crest value;
- increase an initial crest value of the first pulse in a positive direction by an amount that is larger as magnitude of the first current pulse is larger;
- allow the amount by which the initial crest value of the first pulse is increased in the positive direction to be smaller as the ambient temperature of the semiconductor laser is higher, the second pulse waveform being obtained through attenuating with time a crest value of a second pulse that is a negative crest value;
- increase an initial crest value of the second pulse in a negative direction by an amount based on square of the magnitude of the first current pulse or square of a value correlated to the magnitude of the first current pulse; and
- allow the amount by which the initial crest value of the second pulse is increased in the negative direction to be larger as the ambient temperature of the one or more surface-emitting semiconductor lasers is higher.

16. A method of correcting a current pulse waveform, the method comprising:
- superposing a second current pulse on a first current pulse to correct a waveform of the first current pulse, the first current pulse being output from a current source configured to drive a surface-emitting semiconductor laser in a pulsed manner;
- generating the second current pulse through attenuating a crest value of the second current pulse with time;
- increasing an initial crest value of the second current pulse by an amount based on square of the magnitude of the first current pulse or square of a value correlated to the magnitude of the first current pulse; and
- allowing the amount by which the initial crest value is increased to be smaller as ambient temperature of the surface-emitting semiconductor laser is higher.

17. A method of correcting a current pulse waveform, the method comprising:
- superposing a second current pulse on a first current pulse to correct a waveform of the first current pulse, the first current pulse being output from a current source configured to drive a surface-emitting semiconductor laser in a pulsed manner;
- generating the second current pulse through superposing a second pulse waveform on a first pulse waveform, the first pulse waveform being obtained through attenuating with time a crest value of a first pulse that is a positive crest value;
- increasing an initial crest value of the first pulse in a positive direction by an amount that is larger as magnitude of the first current pulse is larger;
- allowing the amount by which the initial crest value of the first pulse is increased in the positive direction to be smaller as the ambient temperature of the surface-emitting semiconductor laser is higher, the second pulse waveform being obtained through attenuating with time a crest value of a second pulse that is a negative crest value;
- increasing an initial crest value of the second pulse in a negative direction by an amount based on square of the magnitude of the first current pulse or square of a value correlated to the magnitude of the first current pulse; and
- allowing the amount by which the initial crest value of the second pulse is increased in the negative direction to be larger as the ambient temperature of the surface-emitting semiconductor laser is higher.

* * * * *